United States Patent
Wu et al.

(10) Patent No.: US 7,404,173 B2
(45) Date of Patent: Jul. 22, 2008

(54) INTERMEDIATE LAYOUT FOR RESOLUTION ENHANCEMENT IN SEMICONDUCTOR FABRICATION

(75) Inventors: Shao-Po Wu, Portola Valley, CA (US); Xin Wang, Sunnyvale, CA (US); Hongbo Tang, San Jose, CA (US); Meg Hung, Saratoga, CA (US)

(73) Assignee: Aprio Technologies, Inc., Sunnyvale, CA (US)

( * ) Notice: Subject to any disclaimer, the term of this patent is extended or adjusted under 35 U.S.C. 154(b) by 304 days.

(21) Appl. No.: 11/074,882

(22) Filed: Mar. 7, 2005

(65) Prior Publication Data

US 2005/0229131 A1    Oct. 13, 2005

Related U.S. Application Data

(63) Continuation-in-part of application No. 10/820,260, filed on Apr. 7, 2004, now abandoned.

(51) Int. Cl.
*G06F 17/50* (2006.01)
*G03F 1/00* (2006.01)
*G03F 9/00* (2006.01)

(52) U.S. Cl. ................. 716/19; 716/21; 430/5; 430/22

(58) Field of Classification Search ............ 716/19–21; 430/5, 22
See application file for complete search history.

(56) References Cited

U.S. PATENT DOCUMENTS

| | | | |
|---|---|---|---|
| 5,900,340 A * | 5/1999 | Reich et al. ............... | 430/22 |
| 6,044,007 A | 3/2000 | Capodieci | |
| 6,370,679 B1 | 4/2002 | Chang et al. | |
| 6,492,066 B1 | 12/2002 | Capodieci et al. | |
| 6,516,459 B1 | 2/2003 | Sahouria | |
| 2002/0100004 A1* | 7/2002 | Pierrat et al. ............... | 716/5 |
| 2003/0110460 A1 | 6/2003 | Pierrat et al. | |
| 2004/0006756 A1 | 1/2004 | Zhang | |

FOREIGN PATENT DOCUMENTS

WO    WO 00/67074 A    11/2000
WO    WO 01/84239 A    11/2001

OTHER PUBLICATIONS

PCT International Search Report and Written Opinion, PCT/US05/10267, Nov. 22, 2006, 7 pages.
Supplementary European Search Report, European Patent Application No. 05729870.5, Dec. 28, 2007, 6 Pages.

* cited by examiner

*Primary Examiner*—Paul Dinh
(74) *Attorney, Agent, or Firm*—Fenwick & West LLP

(57) ABSTRACT

Intermediate resolution-enhancement state layouts are generated based upon an original non-resolution enhanced layout of an integrated circuit and an associated resolution-enhanced layout. The intermediate resolution-enhancement state layout includes fragments corresponding to parts of the original layout and biases associated with the fragments, where the biases indicate distances between the fragments and the resolution-enhanced layout. The fragments are also assigned attributes such as fragment type, fragment location, and biases. The intermediate resolution-enhancement state layouts can be combined to generate the layout for a full chip IC. Two or more intermediate resolution-enhancement state layouts are assembled and are locally reconverged to adjust the resolution enhancement associated with the intermediate resolution-enhancement state layouts and obtain the intermediate resolution-enhancement state layouts for the full IC.

11 Claims, 21 Drawing Sheets

OPC'ed Layout
Original Layout

Fragment Vertex 53

INTERMEDIATE LAYOUT FOR RESOLUTION ENHANCEMENT IN SEMICONDUCTOR FABRICATION

CROSS-REFERENCE TO RELATED APPLICATION

This application is a continuation-in-part application of, and claims priority under 35 U.S.C. §120 from, U.S. patent application Ser. No. 10/820,260, entitled "Method and Apparatus for Selective, Incremental, Reconfigurable and Reusable Semiconductor Manufacturing Resolution-Enhancements," filed on Apr. 7, 2004 now abandoned.

TECHNICAL FIELD

The present invention relates to the design, verification and manufacturing of integrated circuits, and in particular to the incremental and selective reconfiguration of resolution-enhancements on integrated circuit layouts using intermediate resolution enhancement state layouts.

BACKGROUND OF THE INVENTION

While conventional resolution-enhancement technologies (RET), such as optical proximity correction (OPC), are widely applied in advanced design-to-manufacturing processes in order to improve manufacturability and yield of integrated circuit layouts, such resolution enhancements are difficult to verify and the verification results do not necessarily translate to systematic methods of correcting RET/OPC. Furthermore, conventional RET/OPC cannot be applied incrementally or reconfigured selectively, due to proximity and hierarchical interactions of the enhancements. This resulted in "one shot" RET/OPC operations to an entire circuit layout, followed by a verification step, wherein a negative verification result necessitated adjustment to the RET/OPC settings and a reapplication of the full set of adjusted RET/OPC operations to the entire circuit layout. This approach is inefficient and time-consuming. The conventional approach presents a further disadvantage in that it prohibits the application of RET/OPC to standard cells and intellectual property (IP) cores in a way that allows such layouts to be reused as well as characterized early in the design flow.

Accordingly, a fundamentally new approach to RET/OPC is needed, allowing incremental, selective and locally reconfigurable applications of RET/OPC early in the design flow.

SUMMARY OF THE INVENTION

The present invention provides an automated system for incremental and selective reconfiguration of resolution-enhancements of layouts for integrated circuits (ICs), such as optical proximity correction (OPC). Starting from an original non-resolution enhanced layout of the IC and an associated resolution-enhanced layout, an intermediate resolution-enhancement state layout is generated. The intermediate resolution-enhancement state layout includes fragments corresponding to parts of the original layout and biases associated with the fragments, where the biases indicate distances between the fragments and the resolution-enhanced layout. The fragments are also assigned attributes such as fragment type, fragment location, and biases.

The intermediate resolution-enhancement state layouts can be combined to generate the layout for a full chip IC. Two or more intermediate resolution-enhancement state layouts are assembled, and are locally reconverged to adjust the resolution enhancement associated with the intermediate resolution-enhancement state layouts.

Because the intermediate resolution-enhancement state layouts can be combined to generate the layout for a full chip IC, the present invention has the advantage that the entire resolution enhancement process for the full chip does not have to be performed all over when there is a modification to a part of the layout of the IC. Resolution enhancement such as OPC needs to be performed only on a non-RET layout corresponding to the modified part of the IC to generate a modified intermediate resolution enhancement state layout corresponding to the modified part of the IC. Such modified intermediate resolution enhancement state layout can be combined with any other intermediate resolution enhancement state layout to obtain the layout for the full IC. Therefore, it is possible to perform incremental and selective reconfiguration of resolution-enhancements of the IC.

BRIEF DESCRIPTION OF THE DRAWINGS

The teachings of the present invention can be readily understood by considering the following detailed description in conjunction with the accompanying drawings. Like reference numerals are used for like elements in the accompanying drawings.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF EMBODIMENTS

Figures 1A, 1B:
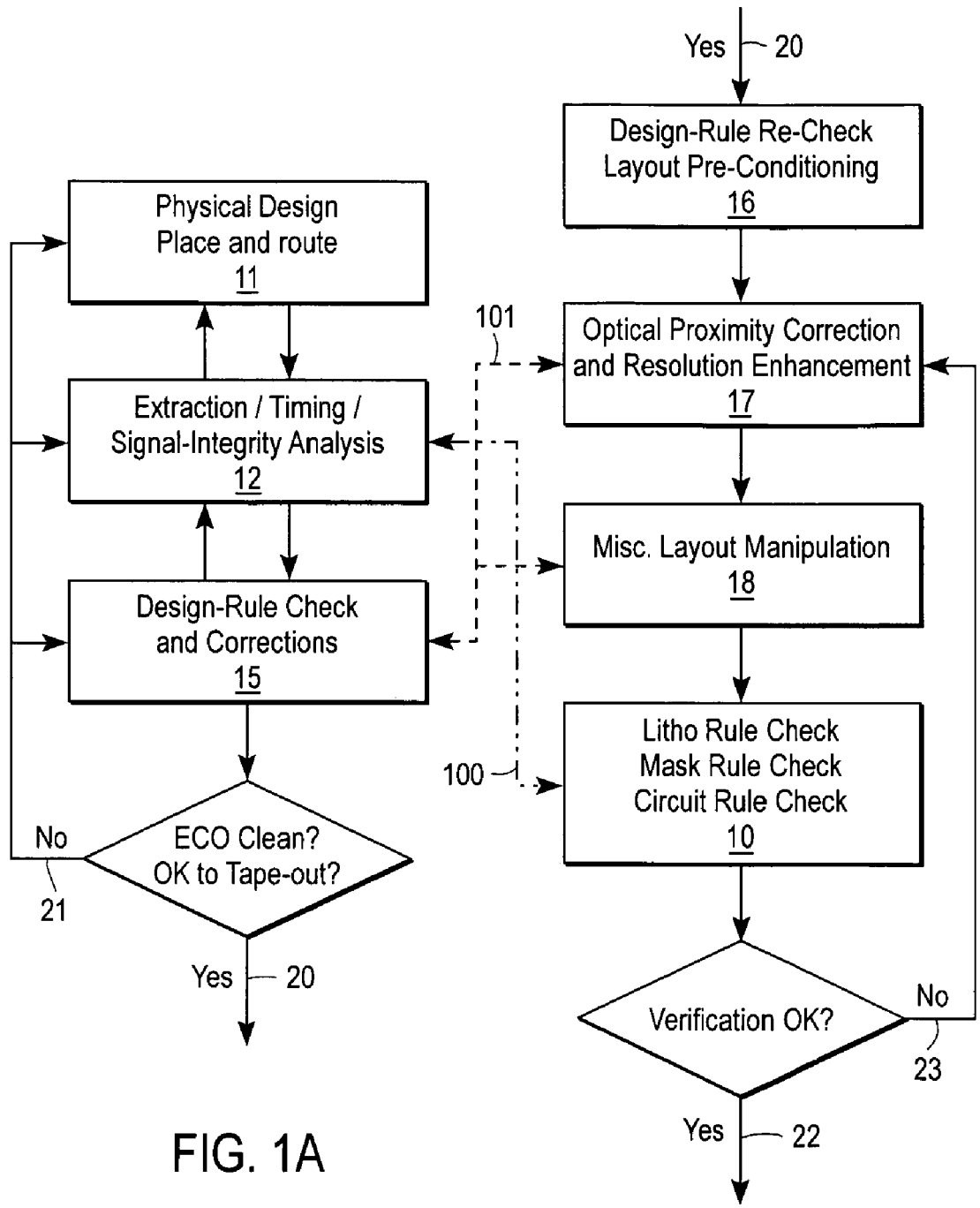
FIG. 1A is a flow diagram illustrating a method for creating and verifying circuit representations up to the point of tape-out, according to an embodiment of the present invention.
FIG. 1B is a flow diagram illustrating a method for processing a circuit layout after tape-out and in preparation for manufacturing, according to an embodiment of the present invention.

FIG. 1A is a flow diagram illustrating a method for creating and verifying circuit representations up to the point of tape-out, and FIG. 1B is a flow diagram illustrating a method for processing a circuit layout after tape-out and in preparation for manufacturing, according to an embodiment of the present invention. The present invention uses intermediate enhancement state layouts (described below) to advantageously enable information exchange (shown by dotted arrows 100 and 101 between FIGS. 1A and 1B) between the design flow (FIG. 1A) and the manufacturing flow (FIG. 1B), thereby allowing the design flow to use information from the manufacturing flow, and vice versa.

The process comprises creating a circuit representation, verifying and predicting a performance of the circuit on silicon, checking design rules for manufacturability of the circuit, adding various layout and/or resolution-enhancements to facilitate the circuit manufacturing processes, and preparing final layout data for mask making. The process begins with the placement and the routing 11 of a circuit, wherein a set of complex circuit representations are assembled. Next, the process performs various verification 12 operations (extraction, timing, and signal-integrity analysis) to predict circuit performance on silicon and to identify a set of one or more critical paths where circuit performance requirements may be in jeopardy. This verification step 12 may use information obtained from the rules check step 10 (FIG. 1B) of the manufacturing flow. The next step in the process is to check 15 the layout against a set of pre-determined worst-case geometric rules (design rules) provided by the manufacturers to ensure manufacturability of the design. This step 15 may use information generated by the resolution-enhancement step 17 (FIG. 1B) or information generated by the layout manipulation step 18 (FIG. 1B) of the manufacturing flow.

Once the physical verifications are passed 20, the layout is taped-out from the design facility to the manufacturing facility. Note that the bi-directional arrows between steps 11, 12 and 15, and the loop 21 provide mechanisms for designers to incrementally build up their designs and fine-tune, correct and accommodate necessary changes without the need to sequentially repeat these steps on the entire design multiple times. For example, some of the steps 11, 12, 15 may be repeated if the physical verifications are not passed 21.

The first step in the manufacturing data preparation process (FIG. 1B) comprises a design-rule check 16, and optionally one or more manufacturing-specific layout pre-conditioning processes, such as separating the layers and biasing specific layers. The next two steps (steps 17 and 18) in the process add one or more resolution-enhancement features such as optical proximity correction to the layout (described below), wherein these steps may use information generated by the design rule check step 15 (FIG. 1A) of the design flow. The layout is then verified 10 against a set of predefined process-simulation-based and/or geometry-based rules for manufacturability in preparation for mask making, wherein this verification step 10 of the manufacturing flow may use information generated by the verification step 12 (FIG. 1A) of the design flow. Note that the above operations are applied sequentially to the entire layout. In case of the rule check step 10 fails, steps 17, 18 and 10 are repeated on the entire layout (via loop 23) to refine and/or correct the resolution-enhancement.

Figure 2A:
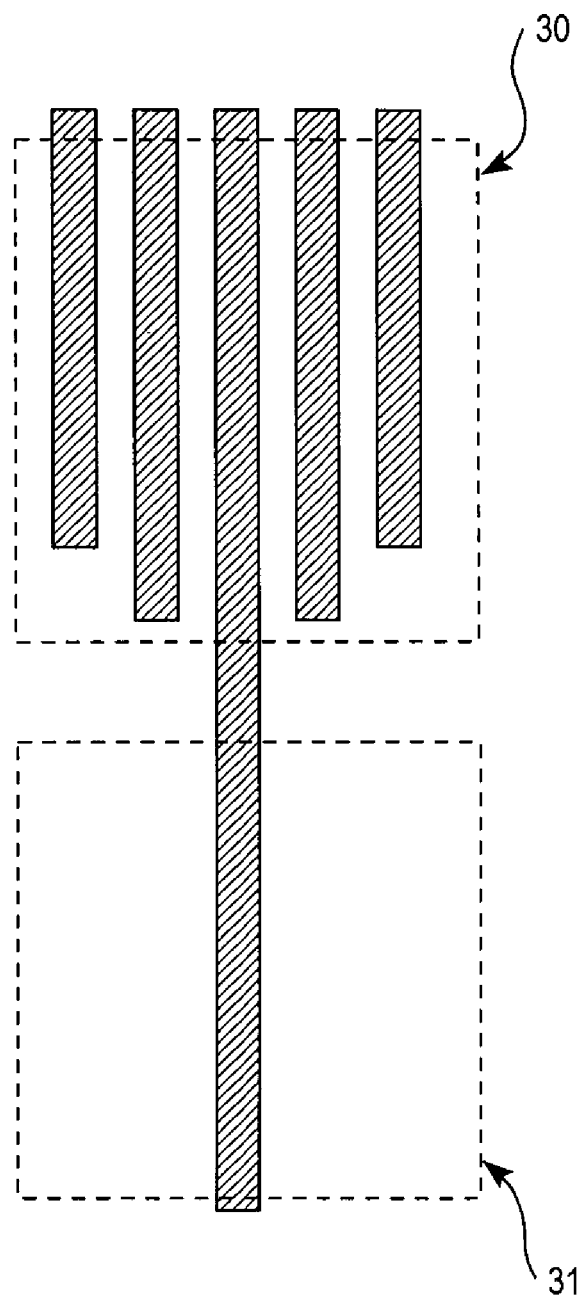
FIG. 2A shows the appearance of a layout portion defining five adjacent metal wires, wherein one region comprises densely packed wires and another region comprises only one isolated wire, according to an embodiment of the present invention.
Figure 2B:
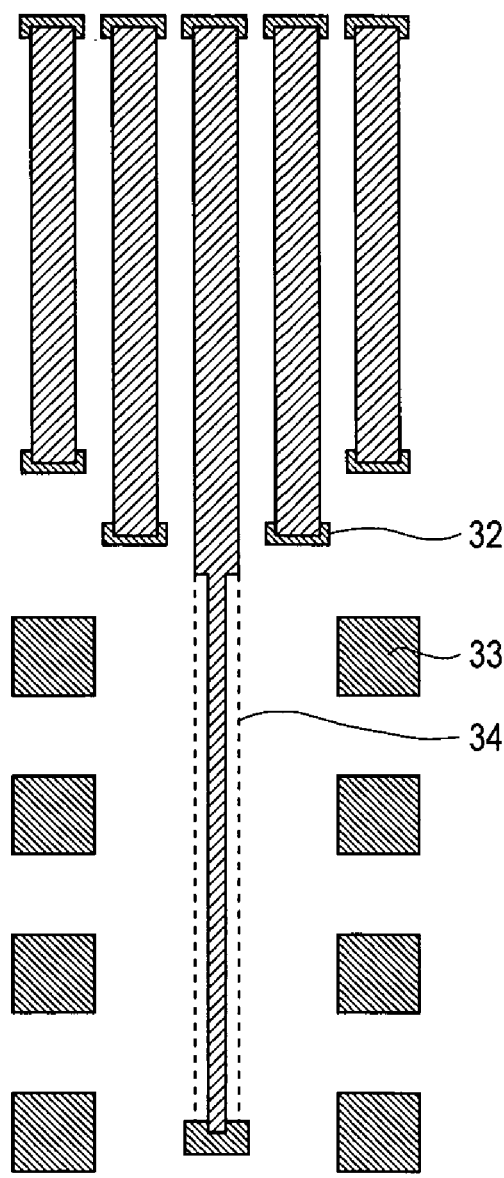
FIG. 2B shows an example of layout enhancement applied to the layout of FIG. 2A in order to reduce proximity effects of the silicon manufacturing process and thereby improve manufacturability and yield, according to an embodiment of the present invention.

FIGS. 2A and 2B illustrate an example of manufacturing-specific layout enhancements applied to metal interconnections. FIG. 2A shows the appearance of a layout portion defining five adjacent metal wires, wherein region 30 comprises densely packed wires and region 31 comprises only one isolated wire, according to an embodiment of the present invention. FIG. 2B shows an example of the layout enhancement applied in order to reduce proximity effects of the silicon manufacturing process and thereby improve manufacturability and yield, according to an embodiment of the present invention. Region 32 shows "additive" optical proximity corrections, region 33 shows "dummy" fill patterns used to equalize the area pattern density, and region 34 shows "subtractive" optical proximity correction. While it is understood that such enhancement features are to be applied accurately with respect to the manufacturing process within which they are intended to be used, it is non-trivial to (a) verify whether the enhancements are properly applied or not (step 10 in FIG. 1B), and (b) correct any enhancements that fail any verification steps. For illustrative simplicity, OPC is used herein below as the example of the resolution enhancement applied to the circuit layout, in order to illustrate the present invention without loss of generality. The same principles can be applied to other types of resolution-enhancements, including but not limited to scattering-bar/assist-features, density-fill patterns, slotting, via-arrays, alternate phase-shifting and/or attenuated phase-shifting.

Figure 3:
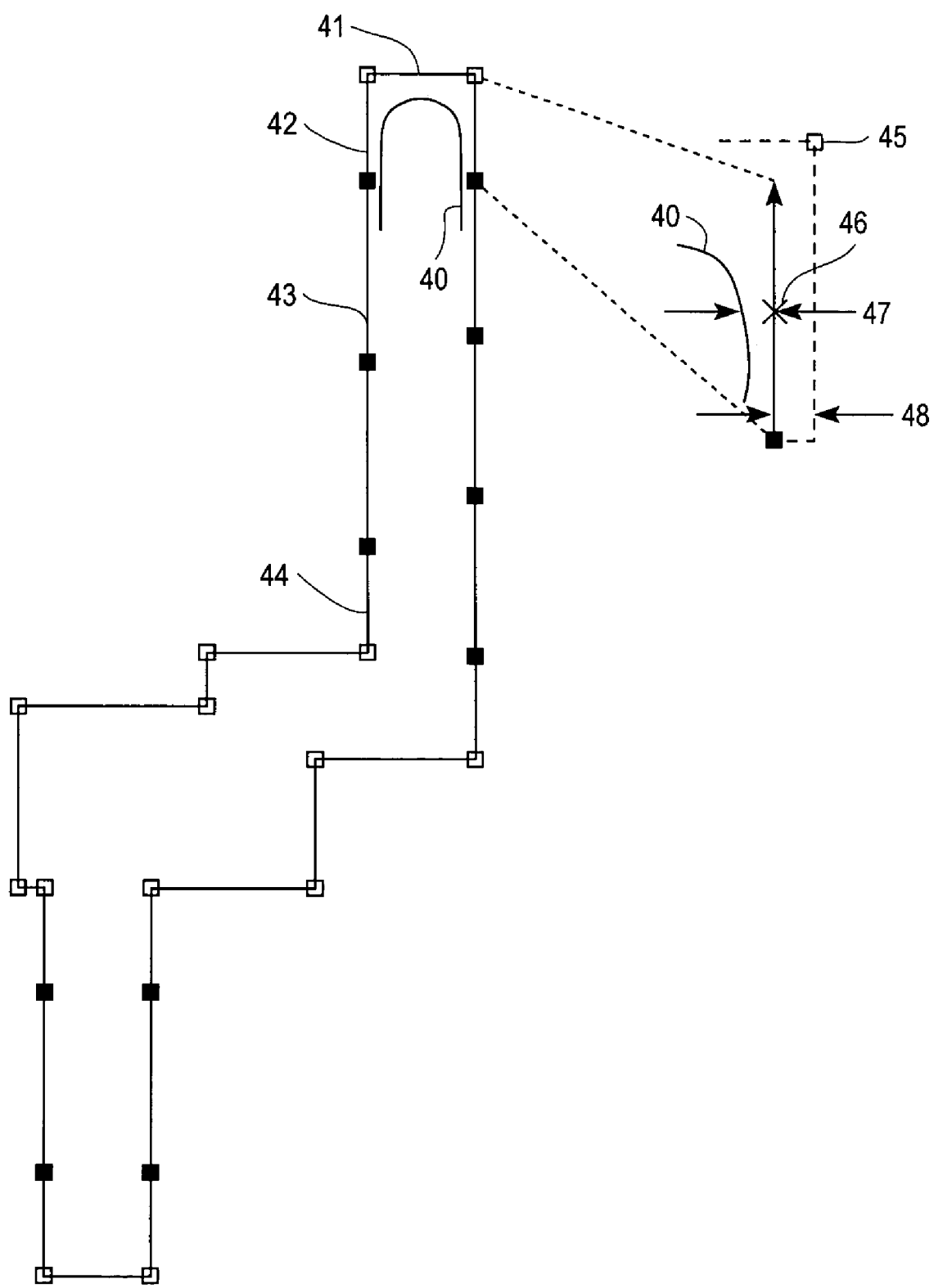
FIG. 3 shows an example of a polygon representing a circuit layout element, according to an embodiment of the present invention.

FIG. 3 shows an example of a polygon representing a circuit layout element, according to an embodiment of the present invention. The polygon edges are sub-divided into fragments (for example, fragments 41, 42, 43 and 44) so as to apply OPC operations at one or more individual fragments. Fragments are the fundamental data objects used in OPC operations (and in other similar types of optical enhancements) according to the present invention. In one embodiment, a fragment comprises the following attributes (illustrated in FIG. 3):

Fragment type—An attribute that identifies the shape (line-edges, corners, line-ends, etc.) association of a given fragment. This attribute further indicates a desirable correction strategy (such as correction tolerance and minimum/maximum correction amounts) associated with the assigned shape. Commonly used fragment types are edges 43, corners 44, line-end ends 41 and line-end corners 42. Other fragment types include (but are not limited to) inner-corners, outer-corners, anti-serifs and turn-ends.

Evaluation anchor 46—The location on a fragment where simulation is applied to evaluate offset (see below).

Offset 47—The distance between the evaluation anchor 46 and the simulated silicon pattern 40. This is the amount of proximity error that should be corrected using OPC.

Bias 48—The amount of correction to be applied. Note that the bias value is not converted into a bias/OPC vertex (see below) unless the OPC process is finished. This provides the capability of reconfiguring OPC corrections ("soft" corrections) at any given time until a joining operation is performed to create a final OPC corrected polygon (to "harden" the corrections).

Joined OPC vertex 45—Once the OPC iterations are completed, the biases from neighboring fragments are joined to form joined OPC vertices. These vertices form the final OPC corrected polygon.

Width/space info—A DRC (Design Rule Check) engine can be invoked either before or after fragmentation in order to record neighboring fragment width/space numbers. This information can be used to identify specific types of fragments, or to properly constrain a bias amount to prevent potential design rule violations.

Figure 4A:
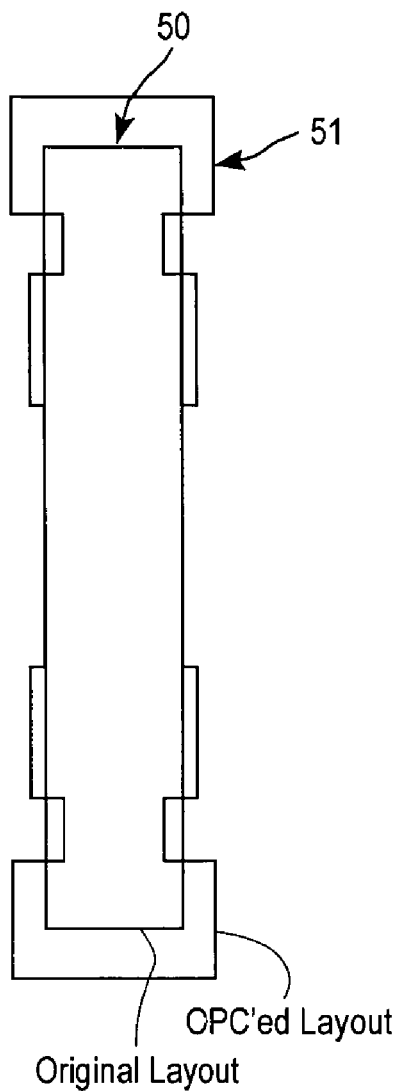
FIG. 4A is a diagram illustrating a non-RET layout and an RET version of the same layout superimposed.
Figure 4B:
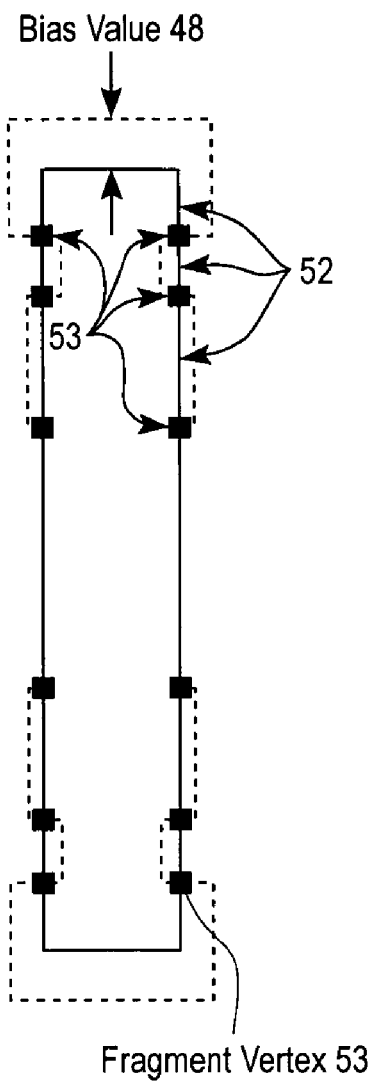
FIG. 4B shows the non-RET layout broken into a set of fragments delimited by a set of vertices, wherein the placement of the vertices (and hence the set of fragments) is determined by the intersections of the non-RET layout and the RET layout.
Figure 4C:
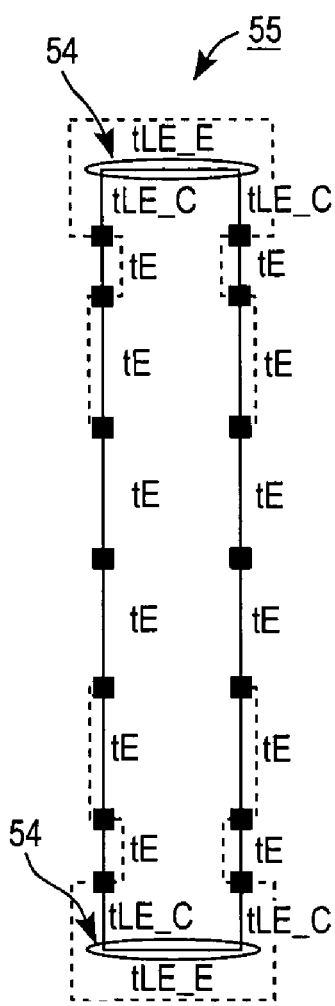
FIG. 4C shows an example of fragment attribute assignments & re-applying fragment rules, according to an embodiment of the present invention.

FIGS. 4A, 4B, and 4C illustrate an example of computing an intermediate enhancement state layout. Specifically, FIG. 4A is a diagram illustrating a non-RET layout 50 and an RET version 51 of the same layout 50 superimposed. FIG. 4B shows the non-RET layout 50 broken into a set of fragments 52 delimited by a set of vertices 53, wherein the vertices 53 (and hence the set of fragments 52) are placed at the intersection of the two layouts 50 and 51. The bias 48 represents the distance between the non-RET layout 50 and the RET layout 51 for the associated fragment. FIG. 4C shows that the resulting layout from FIG. 4B can be further processed such that the fragments are further divided and/or associated with fragment types based on a set of predefined shape rules to generate the intermediate enhancement state layout 55. For example, the two ends 54 of the rectangle are assigned with type "line-end" (tLE_E) as shown; the fragments along the two sides of the rectangle are assigned with type "line-edge" (tE) as shown. The method of generating the intermediate enhancement state layout will be explained in more detail below with reference to FIGS. 5A, 7A-7E, 8A-8F, and FIGS. 11A-11B.

Figure 5A:
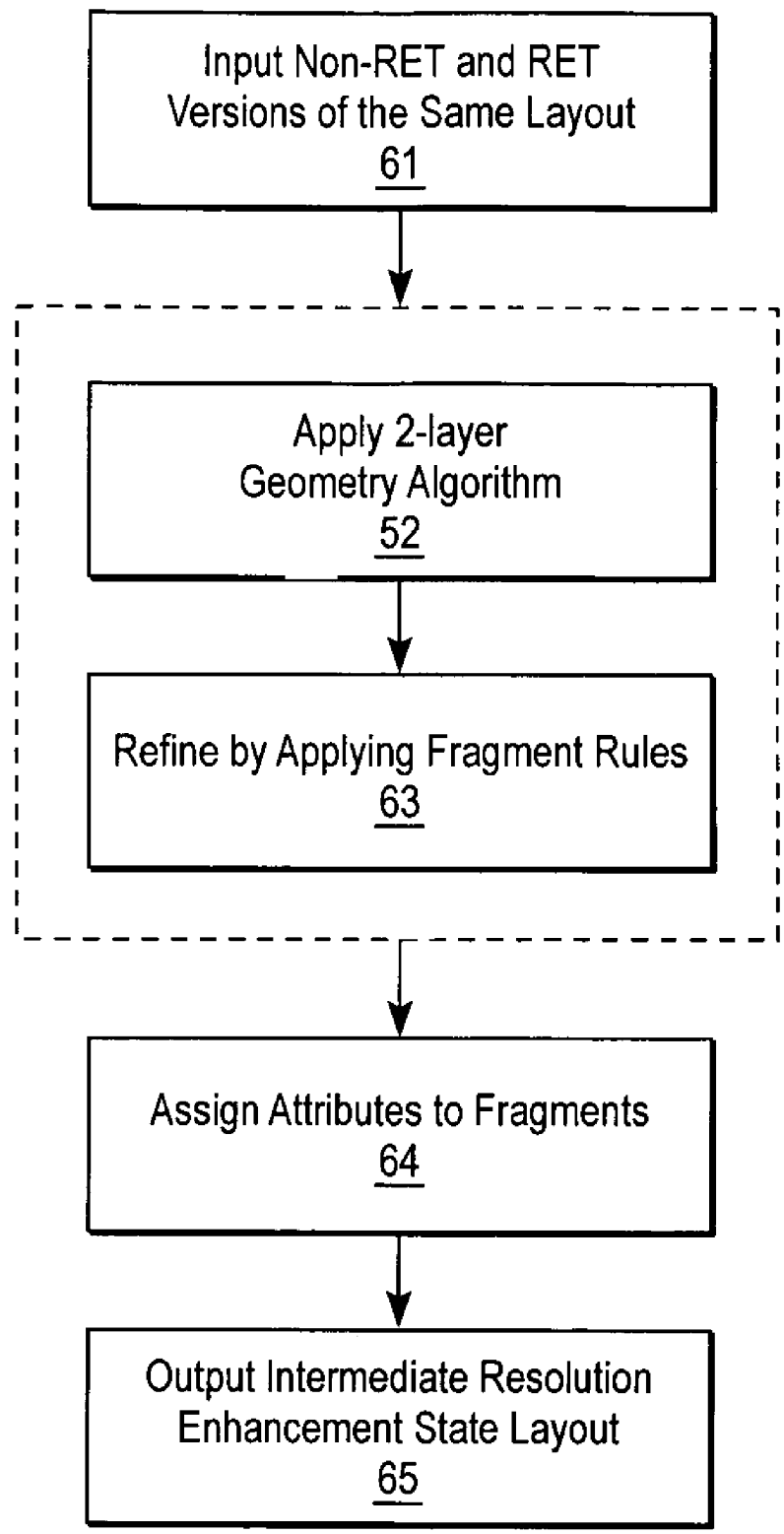
FIG. 5A is a flow diagram showing a method for computing an intermediate enhancement state layout, according to an embodiment of the present invention.

FIG. 5A is a flow diagram showing a method for computing an intermediate enhancement state layout, according to an embodiment of the present invention. First, the non-RET layout 50 and the RET layout 51 of the same layout are input 61 to the layout generation system of the present invention. The non-RET layout 50 is fragmented by first applying 62 a 2-layer geometry-operation algorithm on the pair of layouts 50, 51 to obtain an initial fragmented version of the non-RET layout, and then refining 63 the initial fragmented version of the non-RET layout 50 using a set of fragment rules. Next, a set of fragment attributes are assigned to the fragments of the resulting fragmented layout and the result is output 65 as an intermediate enhancement state layout. A data structure is used for representing a layout fragment or an intermediate enhancement state layout. Such data structure comprises fragment locations, fragment attributes, fragment types and/or fragment biases. Optionally, a data structure is used for representing a plurality of attributes (fragment locations, fragment types and/or fragment biases) describing intermediate enhancement state layout fragments, wherein some of the attributes are grouped according to a mutual proximity of the corresponding fragments.

Figure 7A:
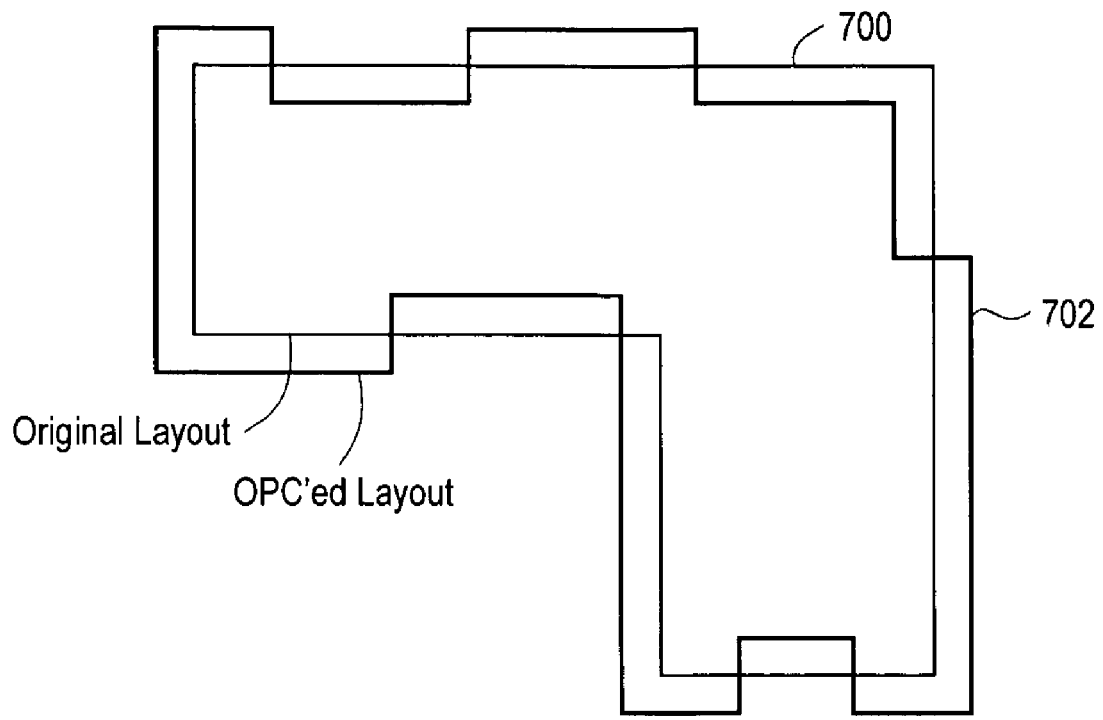
FIGS. 7A-7E further illustrate the 2-layer geometry algorithm, according to an embodiment of the present invention.
Figure 7B:
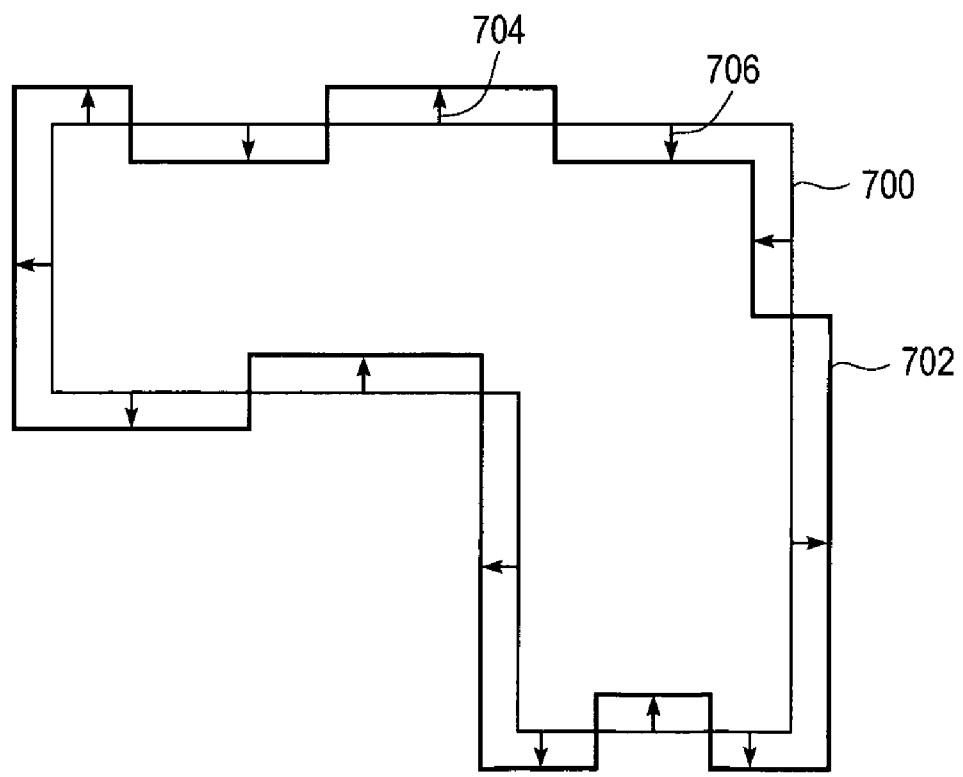
Figure 7C:
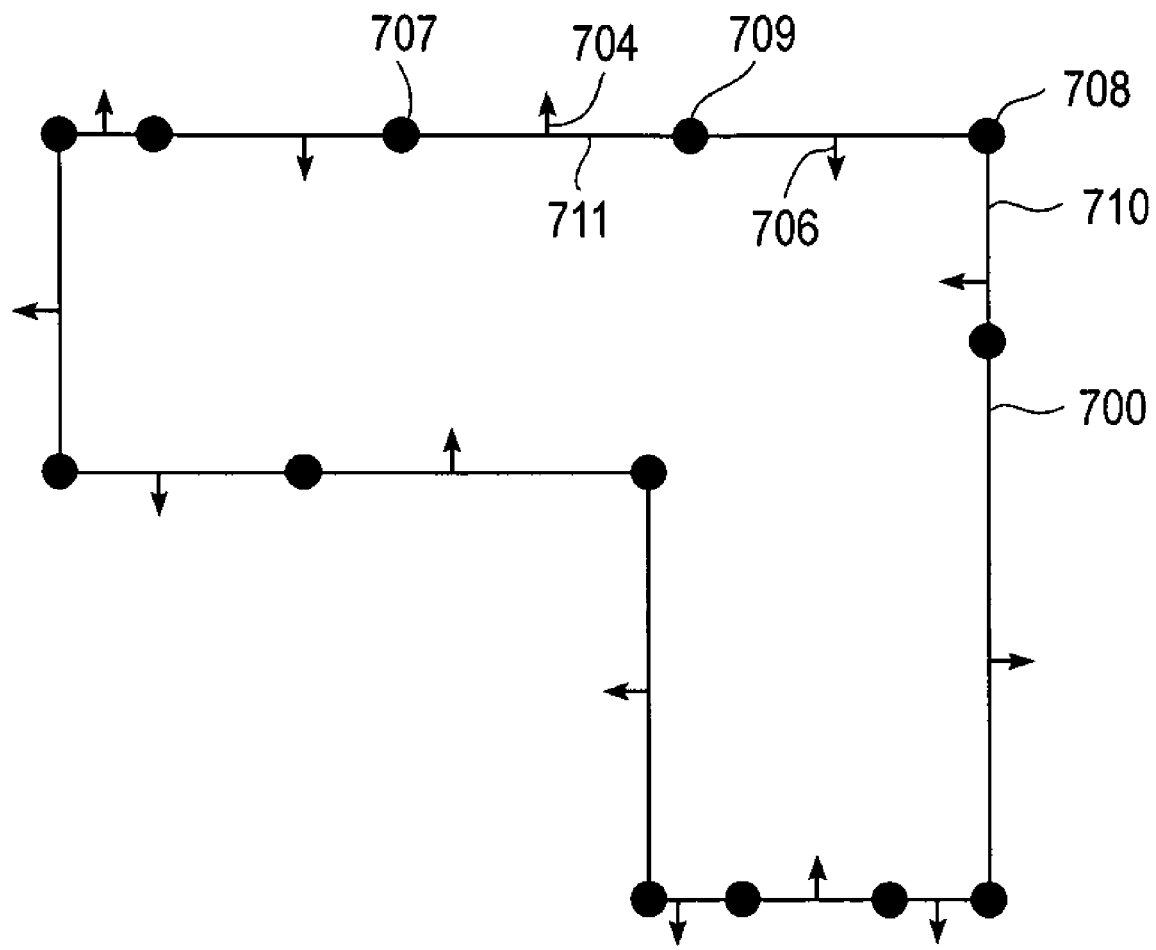

FIGS. 7A-7E further illustrate the 2-layer geometry algorithm applied in step 62 of FIG. 5A, according to an embodiment of the present invention. Referring to FIG. 7A, a non-RET layout (original layout) 700 and a RET-layout (OPC'ed layout) 702 are superimposed. Referring to FIG. 7B, the biases 704, 706 between the non-RET layout 700 and the RET-layout 702 are determined. Referring to FIG. 7C, the vertices 707, 708, 709 and the fragments 710, 711 on the non-RET layout 700 are determined. The vertices 707, 708, 709 are located where the orientation of the biases 704, 706 change (where the fragments have undergone parallel shift). For example, the vertex 709 in FIG. 7C is where the biases 704 and 706 change orientation (the orientation of the parallel shift changes). The fragments 710, 711 are parts of the layout delimited by the vertices 707, 708, 709. For example, the fragment 711 is between the vertices 707, 709.

Figure 7D:
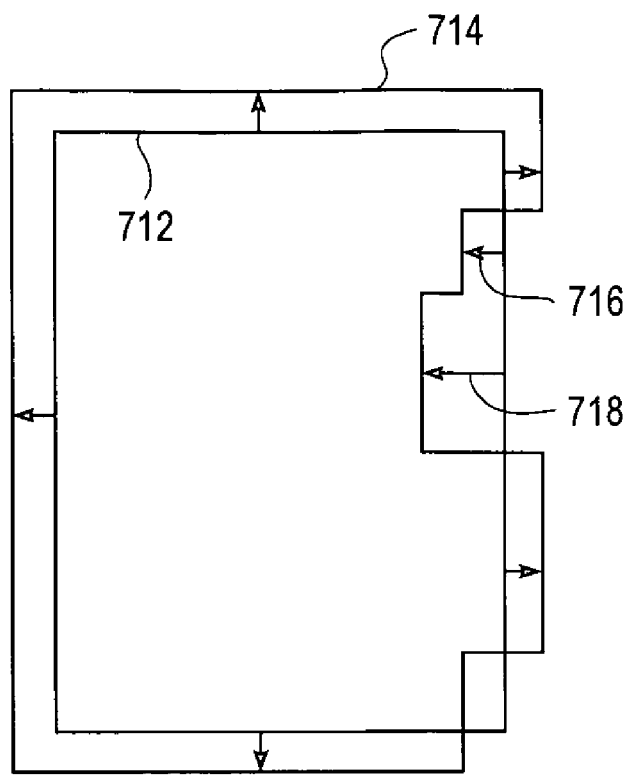
Figure 7E:
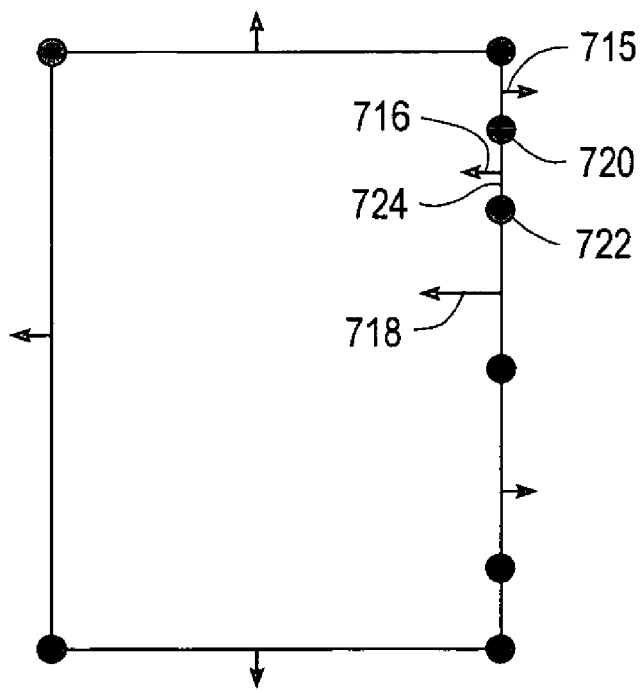

As shown in FIGS. 7D and 7E, a vertex may also be located where the amount of the biases changes (the amount of parallel shift changes). Referring to FIG. 7D, the non-RET layout 712 and the RET layout 714 are superimposed, and the biases 716, 718 are determined. Referring to FIG. 7E, the vertex 722 is located where the amount of the bias 716 changes to bias 718, while the vertex 720 is located where the orientation of the biases 715, 716 changes. Therefore, the 2-layer geometry algorithm defines a minimal set of fragments of the non-RET layout 700 and a corresponding set of biases so as to exactly reproduce the RET layout 702 from the fragment and bias information.

Figure 8A:
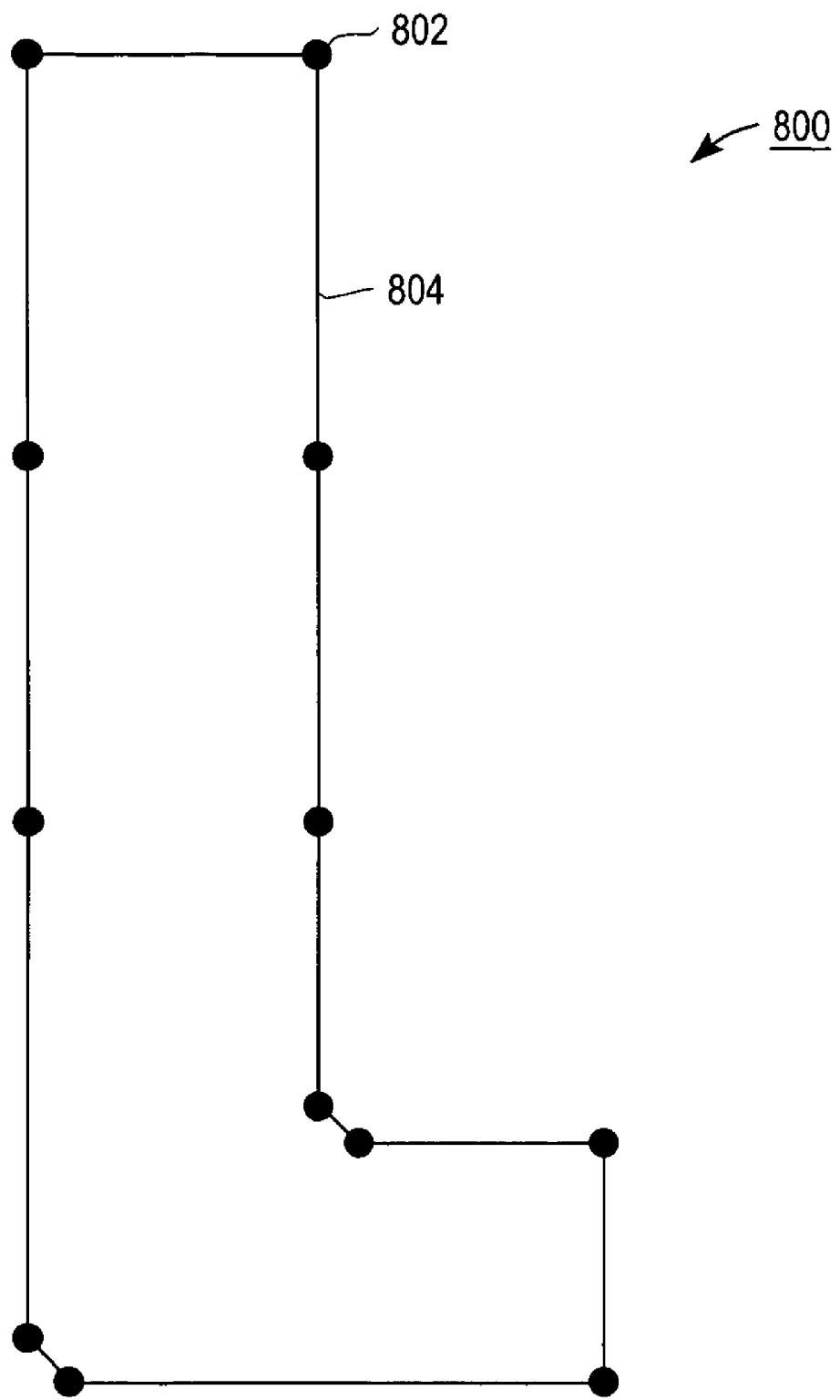
FIGS. 8A-8F further illustrate the fragment rules and the attributes assigned to the fragments, according to an embodiment of the present invention.

FIGS. 8A-8F further illustrate the fragment rules applied in step 63 of FIG. 5A and the attributes assigned to the fragments in step 64 of FIG. 5A, according to an embodiment of the present invention. Referring to FIG. 8A, it is assumed that the 2-layer geometry algorithm has been applied to a non-RET layout 800 according to the method described in step 62 of FIG. 5A and FIGS. 7A-7E to identify the vertices 802 and fragments 804 and generate the initial fragmented version 800 of the non-RET layout. The initial fragmented version layout 800 includes a minimal set of fragments and corresponding biases necessary to produce the non-RET layout from the initial fragmented version 800. However, it is often times desirable to use additional fragments by subdividing some or all of the fragments obtained in the initial fragmented version layout 800 using a set of user-defined rules. These user-defined rules may include shape definitions and corresponding fragmentation rules for these definitions. The biases associated with the subdivided fragments are same as that of the initial fragments from which they were subdivided.

A shape definition is a description of a sequence of edges with rules (often user-specified) for the permitted lengths and angles of those edges. For example, a line-edge shape may be defined as an edge having a length greater than a specified value. For another example, a line-end shape may be defined as a pair of anti-parallel directed edges (i.e., oriented at 180 degrees relative to each other) satisfying specified length rules and connected by one or more edges of a total length less than a specified value. For still another example, a corner shape may be defined as a pair of edges oriented at 90 degrees relative to each other and satisfying certain length constraints, connected by zero or more edges each having a length less than a specified value.

Associated with each shape definition is a set of fragmentation rules indicating how a particular shape as defined above should be fragmented. These rules can also be user-specified and indicate how many fragments should be produced from a particular shape and where those fragments should be located. For example, the user may specify that a line-edge shape should be fragmented into equally spaced fragments of a given length, beginning from one end of the edge to the other end of the edge.

In one embodiment, these shape definition rules are prioritized and applied in a priority order so that, for example, a line-end shape is scanned for and fragmented before a line-edge shape is. This is necessary to resolve ambiguities in shape definition, since certain edges may satisfy the rules of more than one shape definition. For example, as described above, a line-end shape comprises two anti-parallel line-edge shapes, in addition to the one or more connecting edges between them. Therefore, the priority order is applied such that the line-end shape is not misidentified first as two line-edge shapes. The shape definition rules, fragmentation rules, and their priority of application will become more apparent with the examples shown in FIGS. 8B-8F.

Figure 8B:
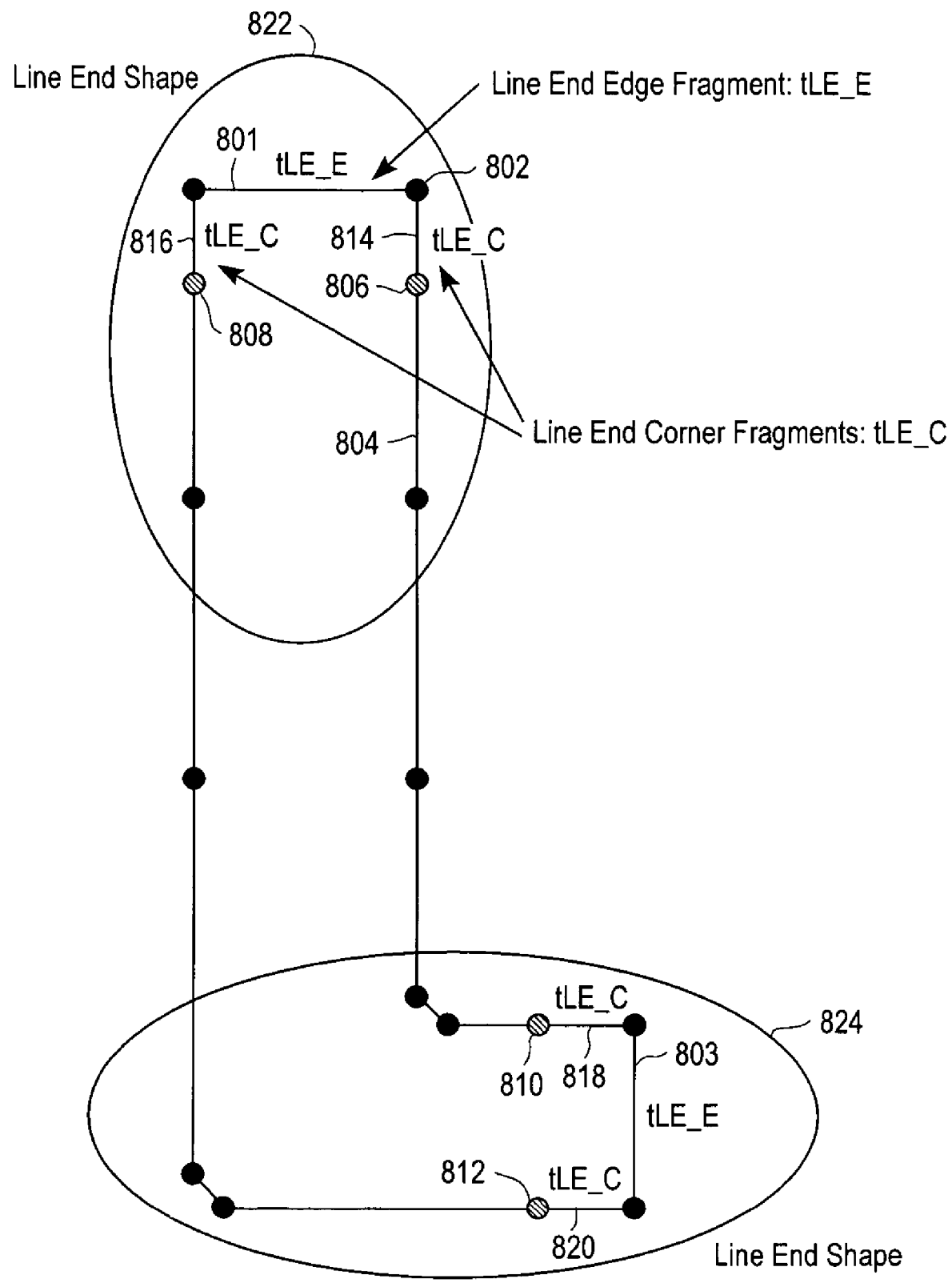

Referring to FIG. 8B, it is shown that the line-end shapes 822, 824 are scanned for and identified in the initial fragmented version layout 800. Each line-end shape 822, 824 includes a pair of anti-parallel directed edges oriented at 180 degrees relative to each other (line-end corner fragments tLE_C) 814, 816, 818, 820 satisfying specified length rules and connected by one or more edges (line end edge fragments tLE_E) 801, 803 of a total length less than a specified value. FIG. 8B also shows that additional vertices 806, 808, 810, and 812 are identified because the line end corners (tLE_C) are defined to have a length less than a specified value according to the shape definition rules. FIG. 8B also shows that the line-end shapes 822, 824 are first identified with a priority higher than other shapes.

Figure 8C:
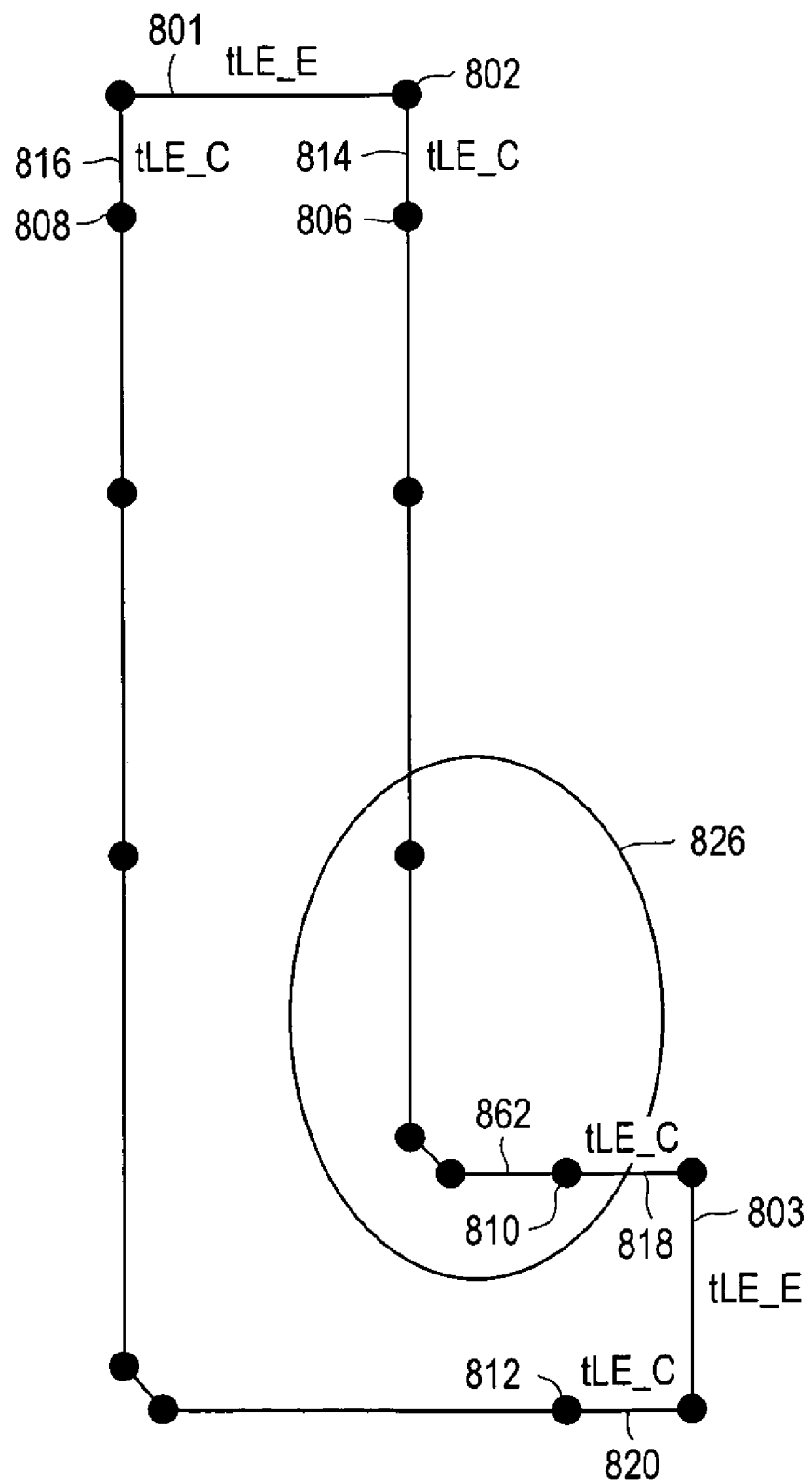

FIG. 8C further shows that the part 826 is not recognized as an inner corner shape because the horizontal fragment 862 is too short according to the shape definition rules. This resulted from the line end shape 824, the line end corner fragment (tLE_C) 818, and the additional vertex 810 being identified with higher priority than that of the inner corner. Therefore, the horizontal fragment 862 will be identified later on separately as an edge shape (tE) rather than part of an inner corner shape.

Figure 8D:
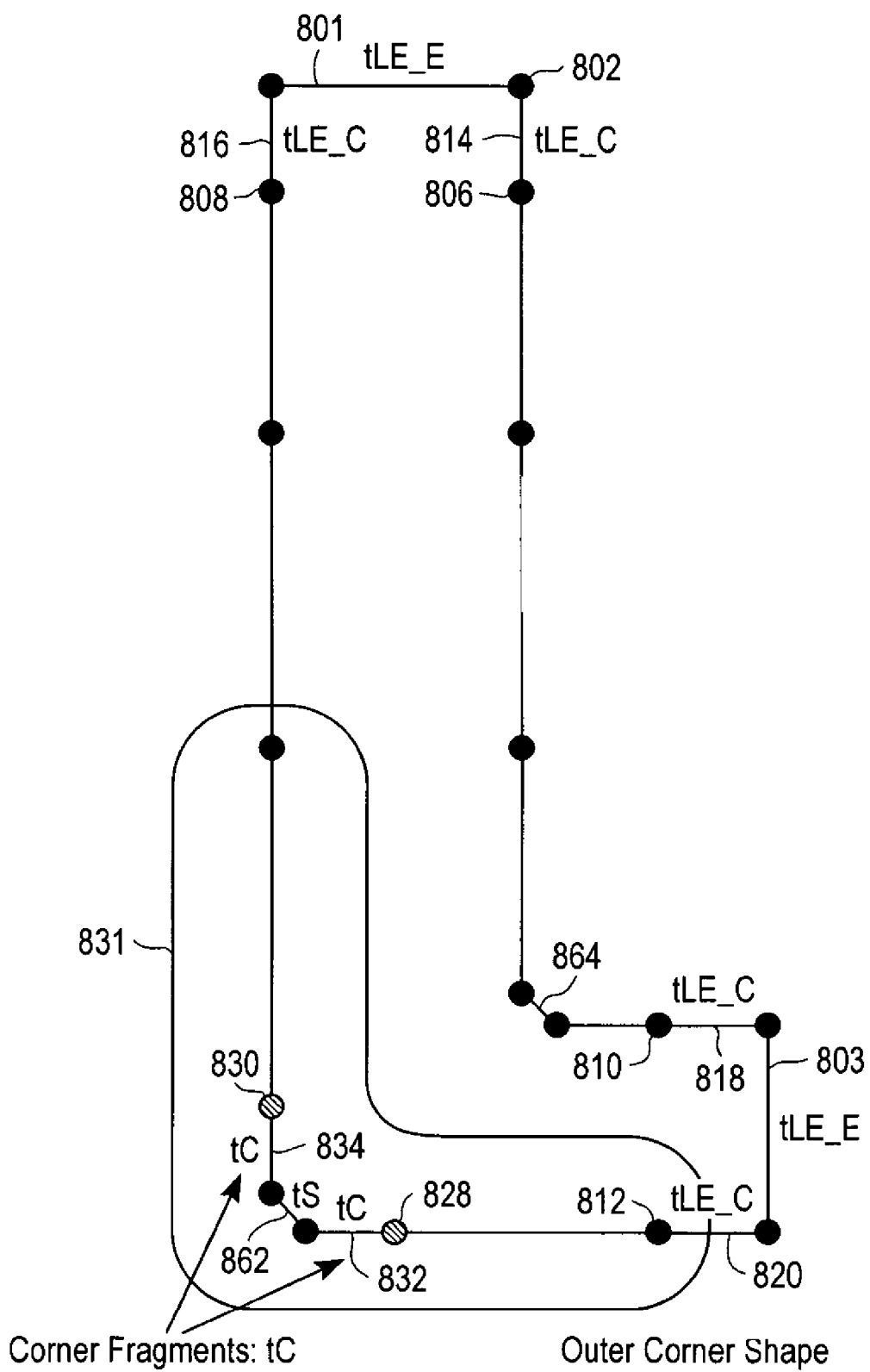

Referring to FIG. 8D, the outer corner shape 831 is scanned for and identified in the initial fragmented version layout 800. The outer corner shape 831 is comprised of two corner fragments (tC) 832, 834 having a length satisfying a specified value range and a skip fragment (tS) 862 between the two corner fragments (tC) 832, 834. Because the corner fragments (tC) 832, 834 are identified with higher priority, additional vertices 830, 828 are also identified.

Figure 8E:
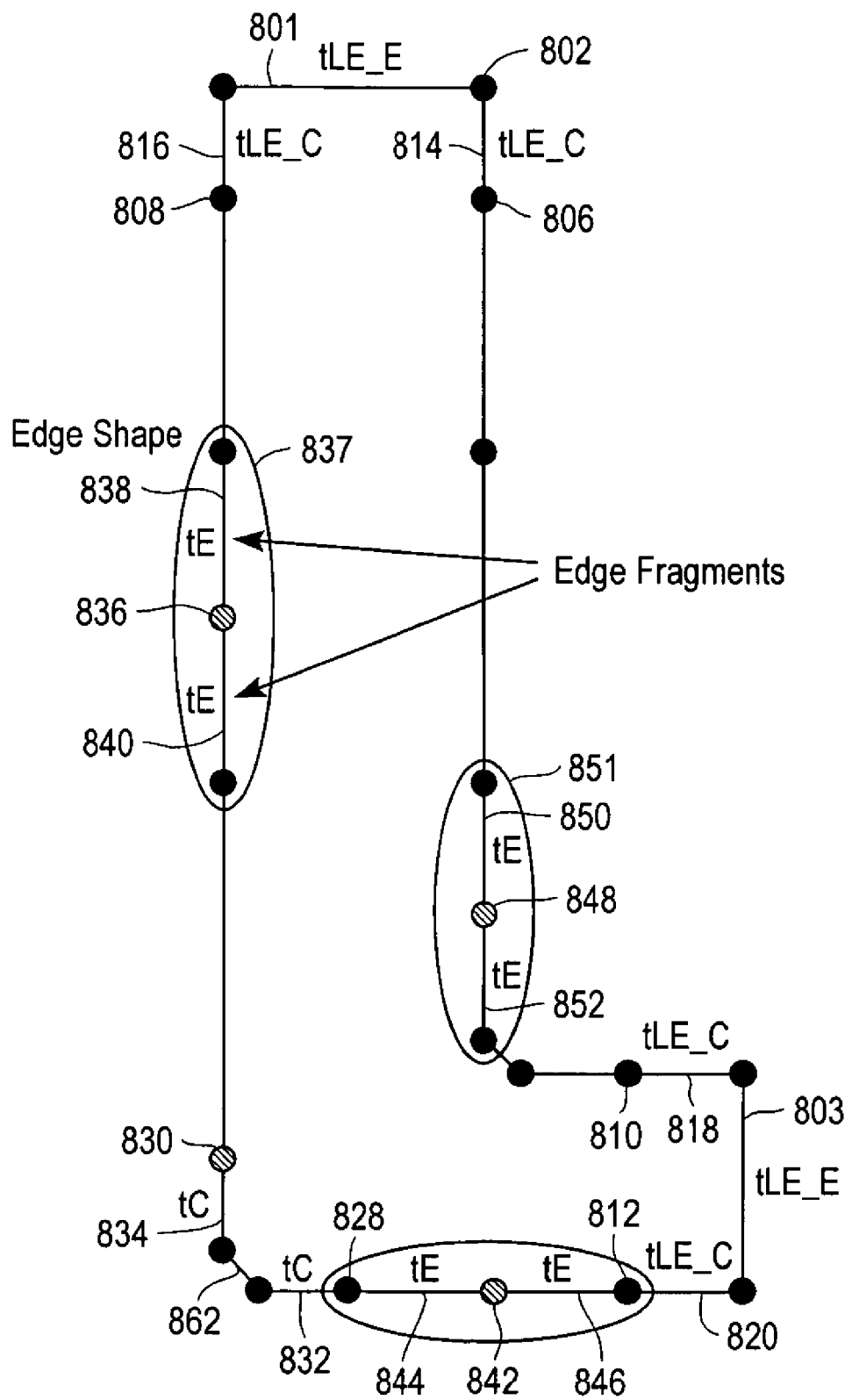

Referring to FIG. 8E, the edge shapes 837, 851 are scanned for and identified in the initial fragmented version layout 800. The edge shapes 837, 851 include two or more edge fragments (tE) 838, 840, 850, and 852 having a length satisfying a specified value range. Thus, additional vertices 836, 848 are also identified.

Figure 8F:
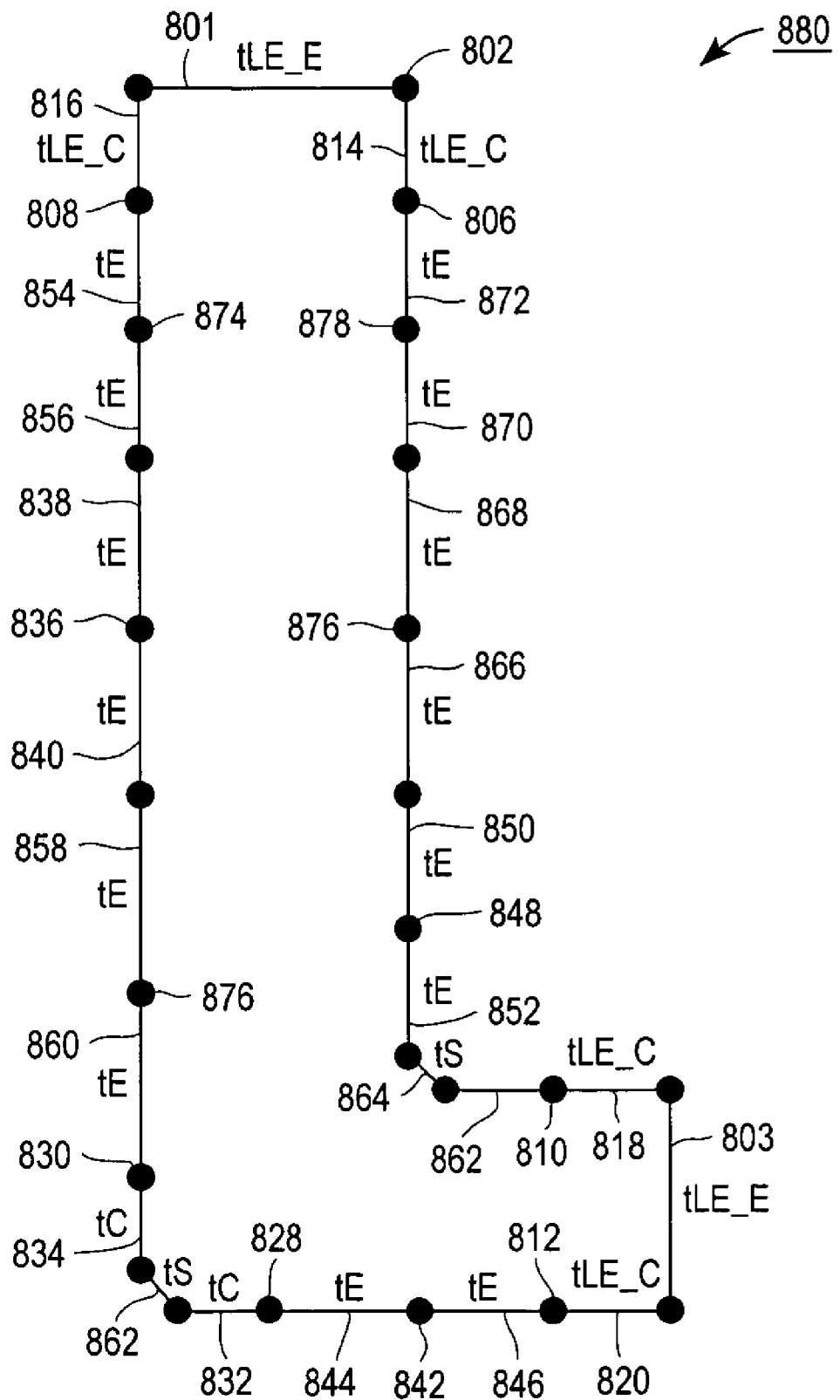

Referring to FIG. 8F, the remaining portions of the initial fragmented version layout 800 are also identified as edge fragments (tE) or skip fragments (tS). For example, the edge fragments (tE) 854, 856, 858, 860, 866, 868, 870, and 872 are identified and the skip fragment (tS) 864 is also identified. The resulting layout 880 in FIG. 8F is the resulting intermediate enhancement state layout, including a plurality of fragments each associated with a fragment type and a bias (not shown in FIG. 8F). As stated previously, the biases associated with the subdivided fragments are same as those of the initial fragments in the initial fragmented version layout 800 from which they were subdivided.

Figure 11A:
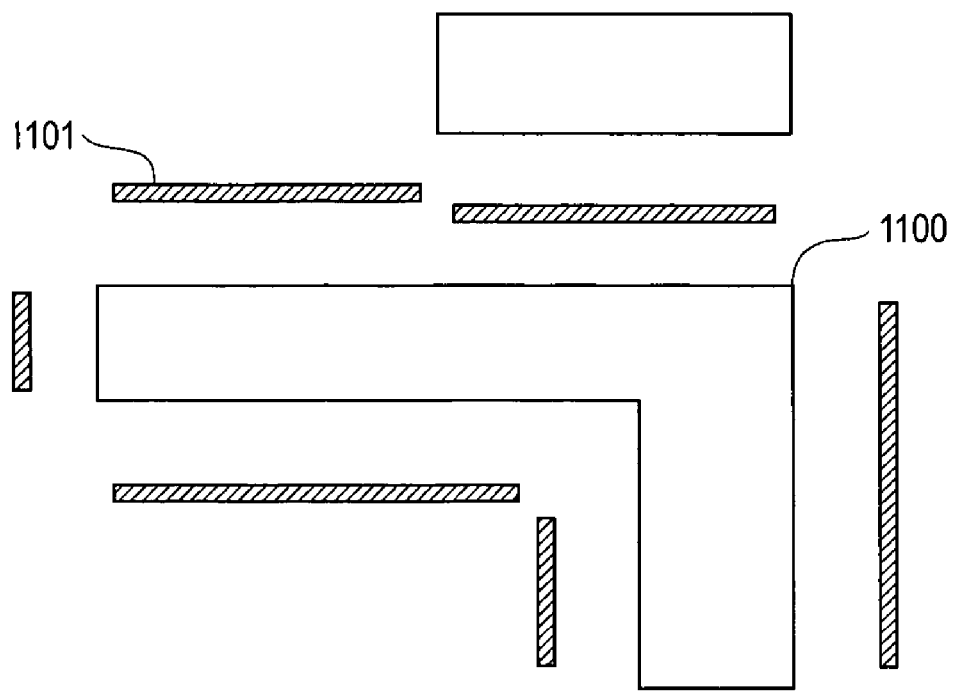
FIGS. 11A and 11B illustrate the intermediate resolution enhancement state layout used with sub-resolution scattering bars, according to one embodiment of the present invention.
Figure 11B:
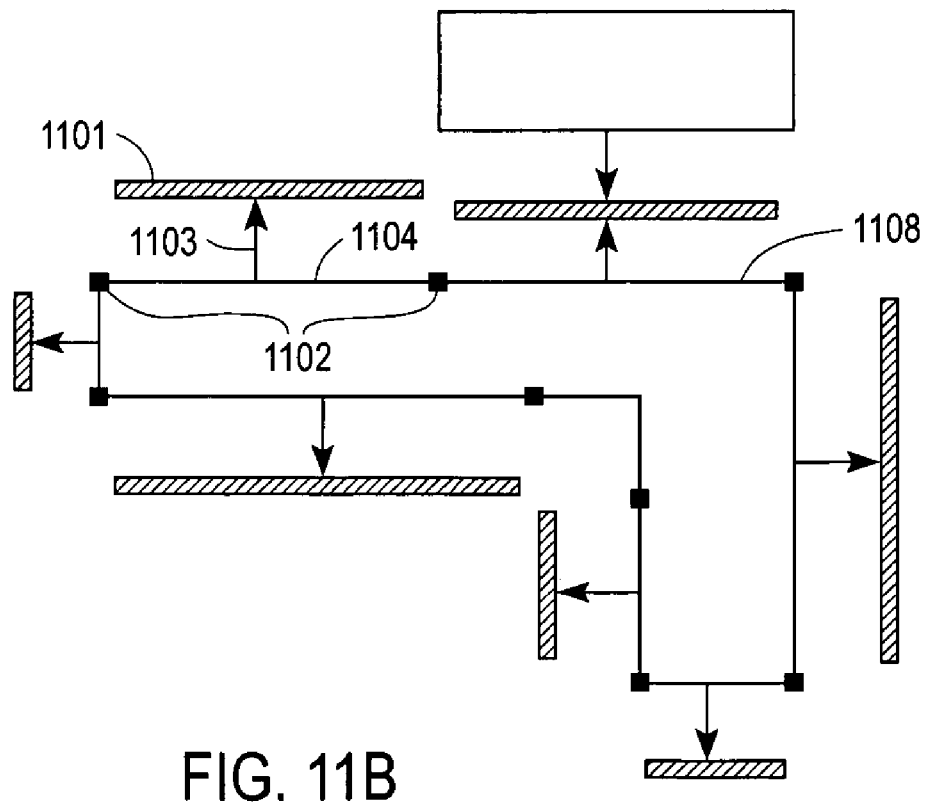

The above-mentioned two-layer geometry operation to construct intermediate resolution enhancement state layouts is applicable not only to optical proximity corrections as illustrated in FIGS. 7A-7E but also to other types of resolution enhancements such as sub-resolution scattering bars. FIGS. 11A and 11B illustrate an intermediate resolution enhancement state layout used with sub-resolution scattering bars, according to one embodiment of the present invention.

Referring to FIG. 11A, the original IC layout 1100 and its sub-resolution scattering bars 1101 are shown. Referring to FIG. 11B, the intermediate resolution enhancement state layout 1108 corresponding to the original IC layout 1100 and its sub-resolution scattering bars 1101 are shown. The intermediate resolution enhancement state layout 1108 includes a plurality of fragments 1104 between vertices 1102, and each fragment 1104 is associated with a bias 1103 indicating the distance between the fragment 1104 on the original layout 1100 and its corresponding sub-resolution scattering bar 1101. The vertices 1102 are located where the biases 1103 change their values or orientations. Therefore, the intermediate resolution enhancement state layout 1108 registers the locations of the scattering bars 1101 and their distances 1103 from the original layout 1100.

Once one or more intermediate enhancement state layouts are generated, they can be assembled into a full-chip in order to undergo incremental resolution-enhancement as follows. However, for example, a part of the chip corresponding to one of the intermediate enhancement state layouts may have to be modified after the intermediate enhancement state layouts for the entire chip is generated. Such modification may be an addition of a new component to that part of the chip or some other change to the chip. When such modification occurs, the non-RET layout corresponding to that part of the chip is reconstructed based on the intermediate enhancement state layout corresponding to that part of the chip. This can be readily done because the intermediate enhancement state layout corresponding to that part of the chip has all the information such as the fragment type, fragment location, fragment attributes, and bias information necessary for reconstructing the non-RET layout from the intermediate enhancement state layout. Then, the RET process is conducted only with respect to such non-RET layout corresponding to the modified part of the chip resulting in a modified RET layout corresponding to the modified part of the chip. Then, a modified intermediate enhancement state layout corresponding to the modified part of the chip is created according to the method described in FIG. 5A, FIGS. 7A-7E, FIGS. 8A-8F, and FIGS. 11A-11B and can be combined with the intermediate enhancement state layout for the other parts of the chip to obtain the a full chip layout.

FIG. 513 is a flow diagram showing a method for incremental and reconfigurable resolution-enhancement, according to an embodiment of the present invention. The method illustrated in FIG. 5B assumes that there are two or more intermediate enhancement state layouts previously generated according to the methods illustrated in FIG. 5A, FIGS. 7A-7E, FIGS. 8A-8F, and FIGS. 11A-11B. Each intermediate enhancement state layout may represent part of the full chip. One or more of the intermediate enhancement state layouts may correspond to a modified part of the chip. Even if none of the intermediate enhancement state layouts are modified, the joining of two or more intermediate enhancement state layouts may be considered a modification to the layout at the boundaries of the joined intermediate enhancement state layouts.

The process starts 70 with one or more intermediate enhancement state layouts being input to the layout generation system of the present invention. The intermediate enhancement state layouts are assembled 71 into a full chip, and locally reconverged 72. The step 72 of locally reconverging the intermediate enhancement state layouts will be explained in greater detail with reference to FIG. 5C and FIGS. 9A-9C. Once the layouts are assembled and locally reconverged, verification 73 of the layout is performed on the full-chip assembly. If the full-chip layout passes 75 the verification step 74, the full-chip layout is output 76. If the full-chip layout does not pass 77 the verification step 74, the verification results are obtained 78, the full-chip layout is selectively refined 79 based on the verification results, and steps 72, 73, and 74 are repeated until the resulting full-chip layout passes the verification step 74. Examples of the verification results may include (a) simulation-based results, for example indications that a resolution-enhanced (e.g., OPC corrected) full-chip assembly is not suited (e.g., is out of manufacturing-tolerance) for a particular manufacturing process, (b) geometry-based results, for example, indicating a violation of minimum spacing rules, and/or other verification rules.

Figure 5B:
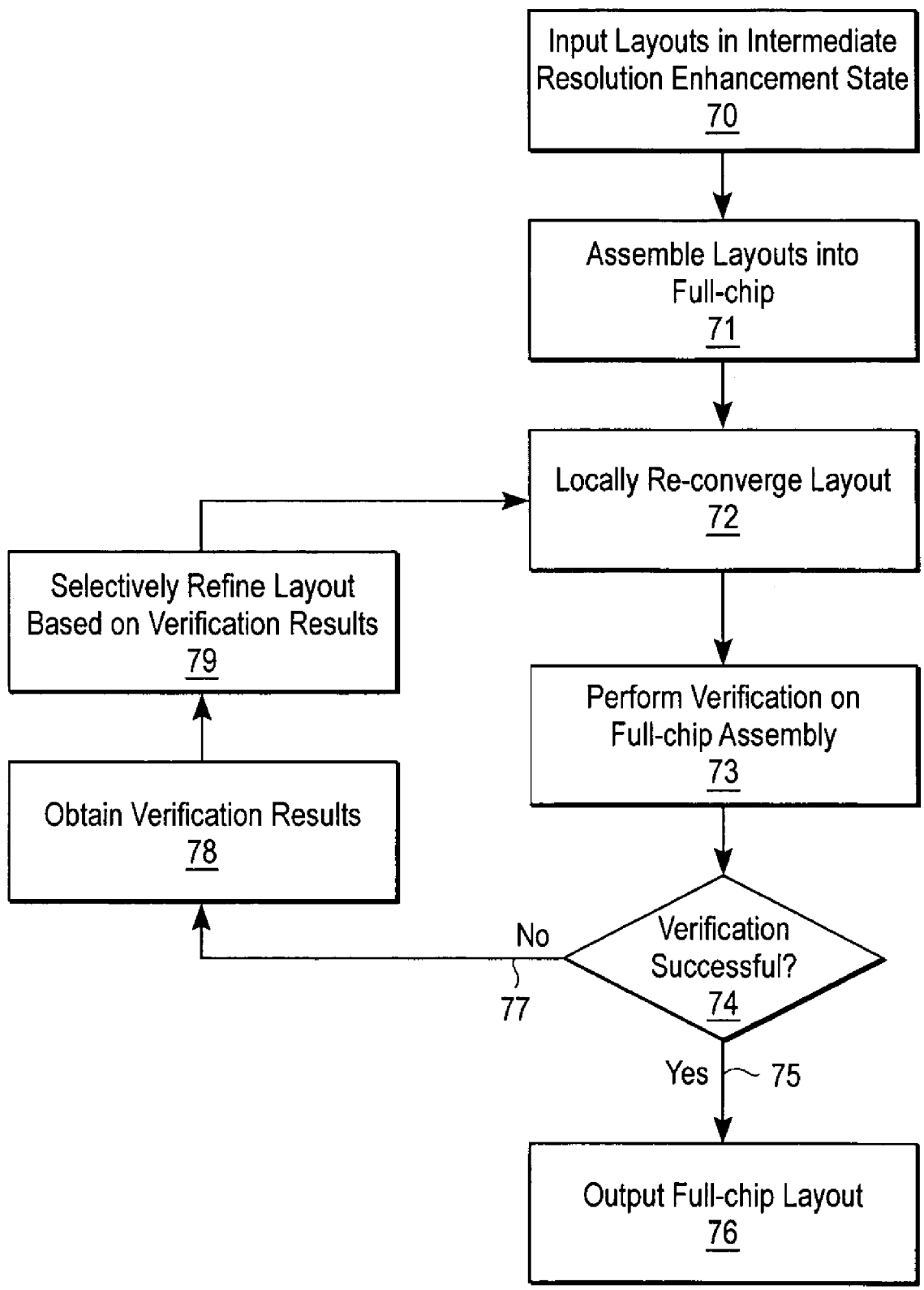
FIG. 5B is a flow diagram showing a method for incremental and reconfigurable resolution-enhancement, according to an embodiment of the present invention.

Note that the method of FIG. 5B may accommodate any modifications made to an IC layout as a result of an engineering change order (ECO). An intermediate enhancement state layout in such a full-chip layout assembly may undergo one or more modifications as a result of an ECO, wherein a modification comprises a redesign of one or more blocks within the layout. The modified layout is then converted to an intermediate enhancement state layout and re-inserted into the full-chip assembly of step 71, after which the method of FIG. 5B is performed from the local re-converging step 72 to eventually arrive at a resolution-enhanced (e.g. OPC corrected) full-chip assembly which passes the verification step 74.

Because the intermediate resolution-enhancement state layouts can be combined to generate the layout for a full chip IC, the present invention has the advantage that the entire resolution enhancement process of the full chip does not have to be repeated when there is a modification to the layout of the IC. Resolution enhancement such as OPC needs to be performed only on the non-RET layout corresponding to the modified part of the IC to generate a modified intermediate resolution enhancement state layout corresponding to the modified part of the IC. Such modified intermediate resolution enhancement state layout can be combined with any other intermediate resolution enhancement state layouts to obtain the layout for the full IC. Therefore, it is possible to perform incremental and selective reconfiguration of resolution enhancements to the IC.

Such incremental and reconfigurable resolution-enhancement method allows for (a) localized and selective perturbations and/or refinements on manufacturing enhancements, based upon verification results, (b) localized and selective resolution-enhancement reconfigurations on IP blocks, cores and/or libraries, based upon manufacturing process settings, as well as (c) localized resolution-enhancement reconfigurations on already resolution-enhanced and assembled IP blocks, cores and/or libraries to accommodate for any necessary enhancement changes due to proximity interactions.

Figure 5C:
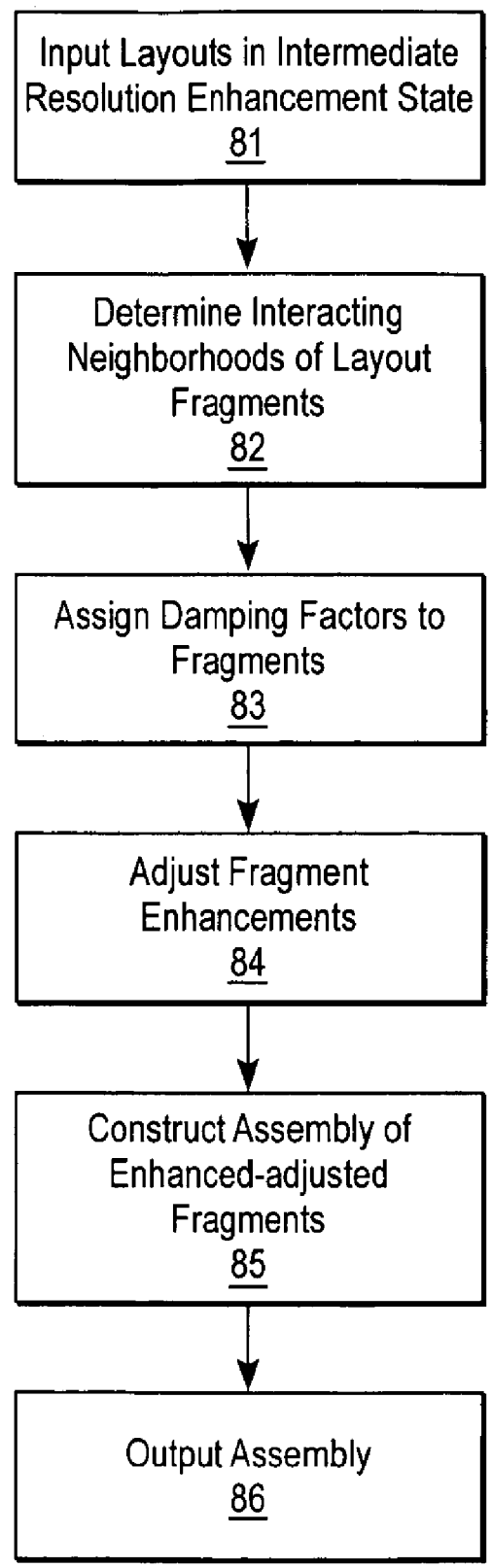
FIG. 5C is a flow diagram describing a method for locally re-converging an assembly of intermediate enhancement layouts, according to an embodiment of the present invention.

FIG. 5C is a flow diagram describing a method for locally re-converging an assembly of intermediate enhancement layouts in step 72 of FIG. 5B, according to an embodiment of the present invention. As the process starts 81 with one or more intermediate enhancement state layouts, the interacting neighborhoods of the layout fragments are determined 82. The interacting neighborhoods are where the layout fragments are to be reconfigured. In one embodiment, such interacting neighborhoods extend to fragments within a certain halo, wherein the halo is set according to the proximity range of the manufacturing processes. Damping factors for the resolution enhancement are assigned 83 to the layout fragments within the interacting neighborhoods, wherein fragments that are closest to the center of the reconfiguring area receive the most damping and fragments that are farthest to the center of the reconfiguring area receive the least damping. This damping strategy allows a smooth local re-convergence of OPC corrections. Then, such fragment enhancements are adjusted 84 according to the assigned fragment damping factors. An assembly of the enhancement-adjusted fragments is constructed 85, and the assembly of the locally reconverged layouts is output 86.

Figure 9A:
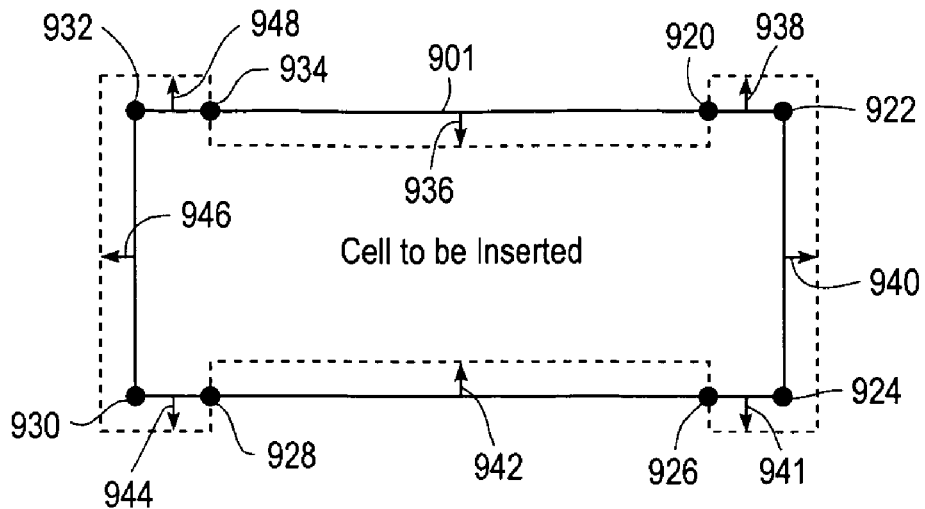
FIGS. 9A-9C further illustrate the local re-convergence algorithm, according to an embodiment of the present invention.
Figure 9B:
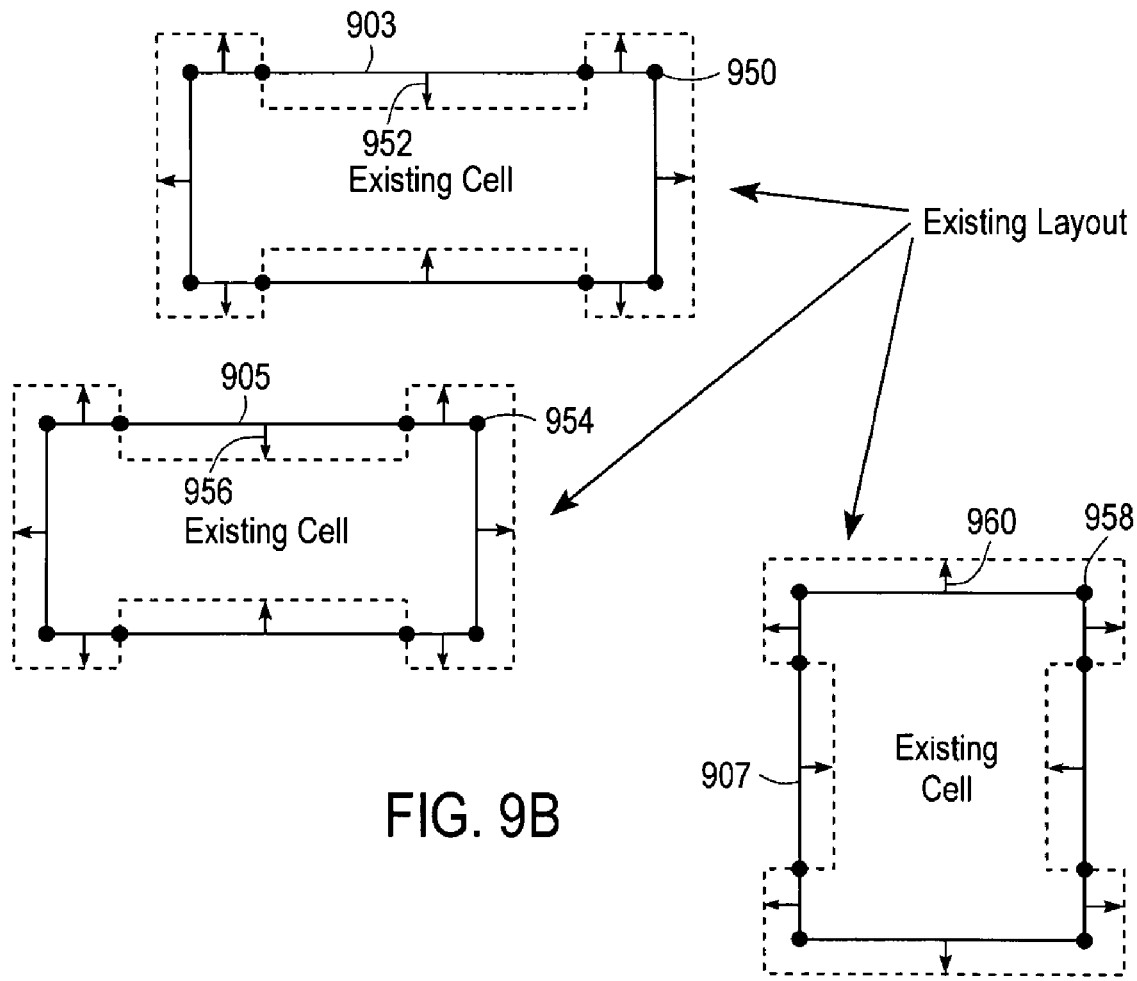
Figure 9C:
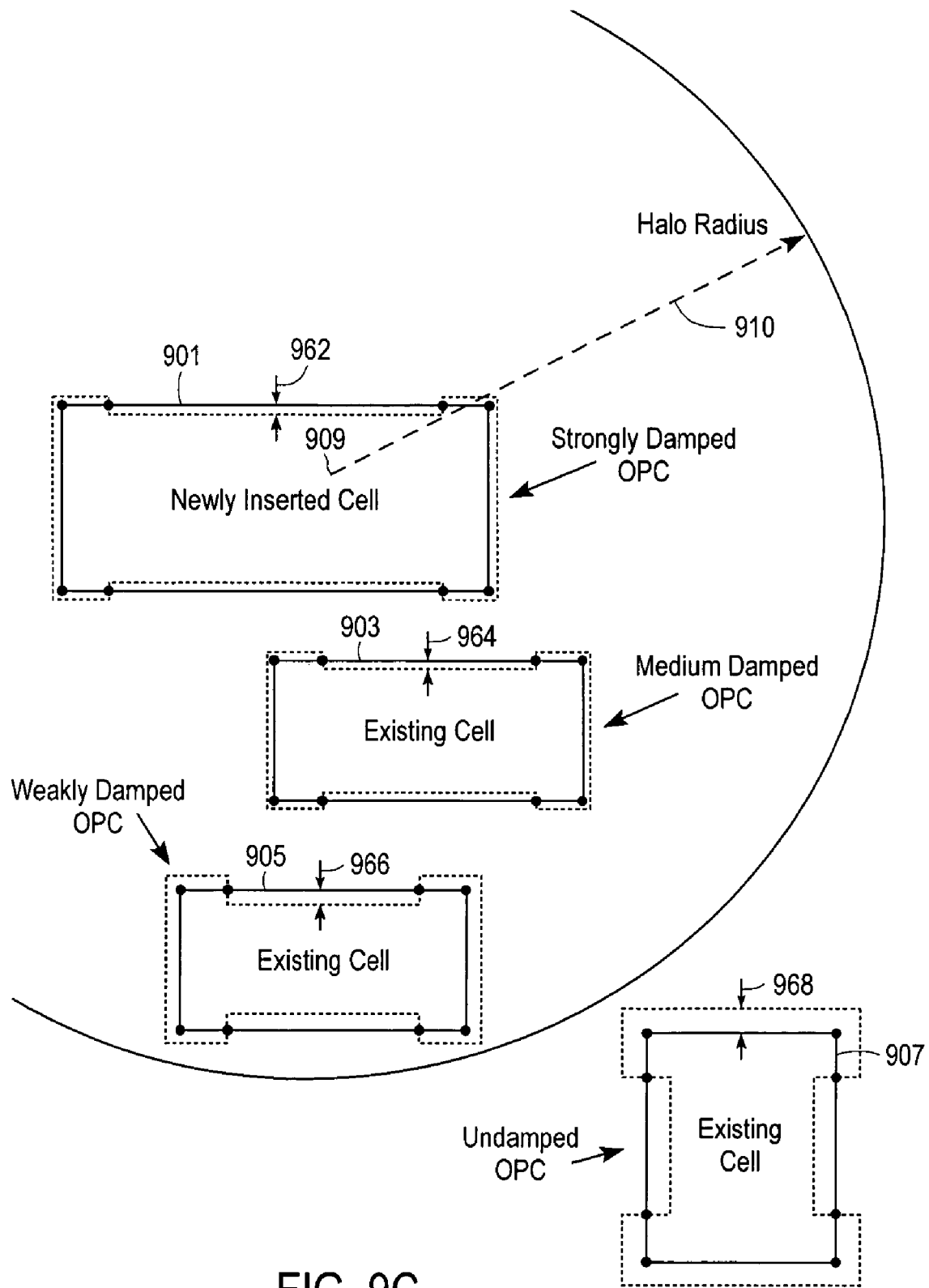

FIGS. 9A-9C further illustrate the local re-convergence method of FIG. 5C, according to an embodiment of the present invention. Referring to FIG. 9A, an intermediate enhancement state layout 901 of a new cell to be inserted into the chip is shown with its vertices 920, 922, 924, 926, 928, 930, 932, 934 and biases 936, 938, 940, 941, 942, 944, 946, 948. The layout 901 is to be inserted into the intermediate enhancement state layouts 903, 905, 907 of existing cells of the chip as shown in FIG. 9B. The intermediate enhancement state layouts 903, 905, 907 also include vertices 950, 954, 958 and biases 952, 956, 960.

Referring to FIG. 9C, when the intermediate enhancement state layout 901 of a new cell is joined with the intermediate enhancement state layouts 903, 905, 907 of existing cells, the interacting neighborhood is determined to be the area within a distance of the halo radius 910 determined from the center 909 of the modified layout, i.e., the intermediate enhancement state layout 901 of a new cell. OPC factors in an area closer to the center 909 of the intermediate enhancement state layout 901 receive stronger damping, while OPC factors in an area farther away from the center 909 of the intermediate enhancement state layout 901 receive weaker damping. In one embodiment, the damping factor may linearly decay with the distance from the center of the modified intermediate enhancement state layout 901. In another embodiment, the damping factor may exponentially decay with the distance from the center of the modified intermediate enhancement state layout 901.

For example, the bias 962 is much smaller than the original bias 936 in FIG. 9A, because the OPC factor and hence the bias 962 received strong damping due to its proximity to the center 909. The bias 964 is somewhat smaller than the original bias 952 in FIG. 9B, because the OPC factor and hence the bias 964 received medium damping. The bias 966 is only slightly smaller than the original bias 956 in FIG. 9B, because the OPC factor and hence the bias 966 received the weak damping due to its proximity to the center 909. The bias 968 is same as the bias 960 in FIG. 9B, because the bias 969 is outside of the interacting neighborhood and hence the OPC factor corresponding to the bias 968 did not receive any damping.

It is an advantageous aspect of the present invention that the processing involved in resolution-enhancement of a plurality of blocks in a layout can be combined. For example, a plurality of blocks in a layout may be selected to generate (a) a new "common-block" which comprises layout elements that are common to the selected blocks as well as (b) a plurality of difference-sets representing differences between the individual selected blocks and the common-block. Resolution-enhancement is performed on the common-block, and the resolution-enhanced common-block is combined with the difference-sets to obtain a set of resolution-enhanced counterparts to the originally selected blocks. The originally selected block is replaced with its resolution-enhanced counterparts, and the inserted resolution-enhanced counterparts in the layout are reconverged.

Figure 6:
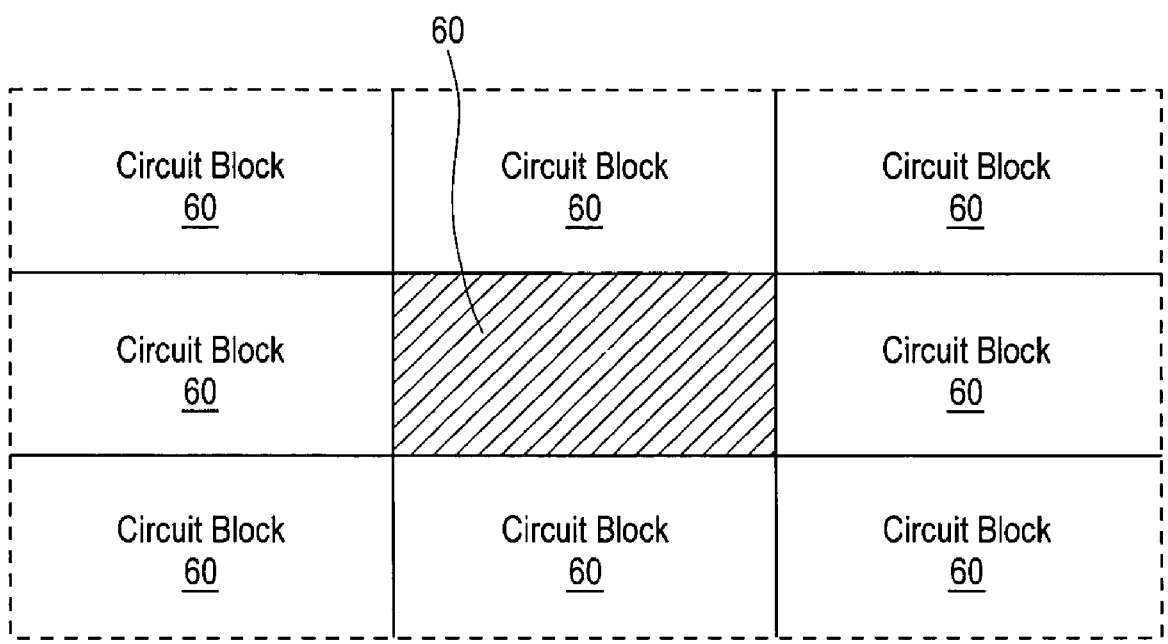
FIG. 6 is a diagram illustrating mirroring of a circuit block in order to simulate a set of neighbors, according to an embodiment of the present invention.

It is a further advantageous aspect of the present invention that mirroring can be used to simulate a set of neighbors when performing resolution-enhancement on an individual block, as shown in FIG. 6. When performing resolution-enhancement on a block 60, mirroring one or more copies of the block 60 around the block 60 simulates a set of neighbors, affecting the outcome of the resolution-enhancement process on block 60. The block 60 can then be re-inserted into a layout or assembled with other blocks and re-converged.

Figure 10:
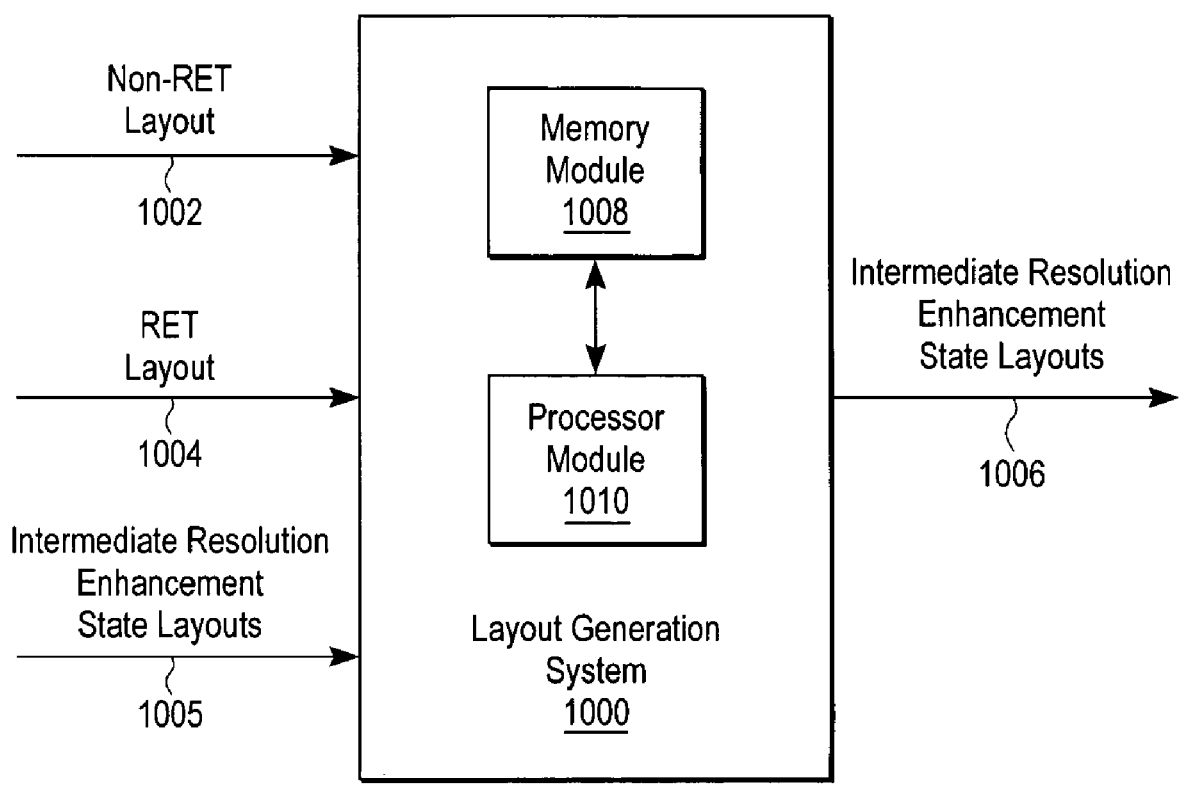
FIG. 10 is a block diagram illustrating a layout generation system according to one embodiment of the present invention.

FIG. 10 is a block diagram illustrating a layout generation system 1000 according to one embodiment of the present invention. The layout generation system 1000 receives a non-RET layout 1002 and the resolution enhanced (RET) layout 1004 to generate the intermediate enhancement state layout 1006 according to the methods described above with reference to FIGS. 5A, 7A-7E, 8A-8F, and 11A-11B. The layout generation system 1000 can also receive a plurality of intermediate enhancement state layouts 1005, and generate a modified intermediate enhancement state layout 1006 according to the methods described above with reference to FIGS. 5B, 5C, and 9A-9C.

The layout generation system 1000 may be a computer that runs layout generation software configured to perform such methods. Such computer includes at least a processor module 1010 for running such layout generation software and a memory module 1008 for storing such layout generation software. Such layout generation software may be stored as a computer program product on a separate computer readable medium or on a memory device 1008 as firmware within the computer for the layout generation system 1000.

Although the present invention has been described above with respect to several embodiments, various modifications can be made within the scope of the present invention. For example, the two-layer geometry operation for constructing the intermediate resolution enhancement state layout is not limited to any specific type of resolution enhancement, but is applicable to any type of resolution enhancements such as optical proximity correction and sub-resolution scattering bars. Accordingly, the disclosure of the present invention is intended to be illustrative, but not limiting, of the scope of the invention, which is set forth in the following claims.

What is claimed is:

1. A computer-implemented method of generating a layout for an integrated circuit, the method comprising the steps of:
   receiving a first layout that is not resolution enhanced;
   receiving a second layout corresponding to the first layout, the second layout being a resolution enhanced layout of the first layout;
   generating a third layout based upon the first layout and the second layout, the third layout including a plurality of fragments and a plurality of biases associated with the fragments, the fragments corresponding to parts of the first layout and the biases indicating distances between the fragments and the second layout; and
   applying a two-layer geometry algorithm to the first layout and the second layout to generate a fourth layout, the fourth layout including vertices located at intersections of the first layout and the second layout, the vertices determining an initial set of the fragments and an initial set of the biases associated with the initial set of the fragments.

2. The computer-implemented method of claim 1, wherein the vertices are where two biases of the initial set of biases change orientation.

3. The computer-implemented method of claim 1, wherein the vertices are where two biases of the initial set of biases change value.

4. The computer-implemented method of claim 1, further comprising the steps of:

applying shape definition rules to the initial set of the fragments to identify a plurality of shapes in the fourth layout;
   applying fragmentation rules associated with the shape definition rules to identify additional vertices in the fourth layout and subdivide at least part of the initial set of the fragments; and
   assigning attributes to the subdivided fragments to obtain the third layout, the attributes including locations of the fragments, types of the fragments, and the biases associated with the fragments.

5. The computer-implemented method of claim 4, wherein the shape definition rules are applied according to a priority.

6. The computer-implemented method of claim 4, wherein the shapes include a line-end shape, an inner corner shape, an outer corner shape, and an edge shape.

7. The computer-implemented method of claim 1, wherein the third layout is an intermediate resolution enhancement state layout.

8. A computer readable medium storing a computer program product configured to perform a method of generating a layout for an integrated circuit, the method comprising the steps of:
   receiving a first layout that is not resolution enhanced;
   receiving a second layout corresponding to the first layout, the second layout being a resolution enhanced layout of the first layout;
   generating a third layout based upon the first layout and the second layout, the third layout including a plurality of fragments and a plurality of biases associated with the fragments, the fragments corresponding to parts of the first layout and the biases indicating distances between the fragments and the second layout; and
   applying a two-layer geometry algorithm to the first layout and the second layout to generate a fourth layout, the fourth layout including vertices located at intersections of the first layout and the second layout, the vertices determining an initial set of the fragments and an initial set of the biases associated with the initial set of the fragments.

9. The computer readable medium of claim 8, wherein the method further comprises the steps of:
   applying shape definition rules to the initial set of the fragments to identify a plurality of shapes in the fourth layout;
   applying fragmentation rules associated with the shape definition rules to identify additional vertices in the fourth layout and subdivide at least part of the initial set of the fragments; and
   assigning attributes to the subdivided fragments to obtain the third layout, the attributes including locations of the fragments, types of the fragments, and the biases associated with the fragments.

10. A layout generation system comprising:
   a memory module storing computer instructions configured to perform a method of generating a layout for an integrated circuit, the method comprising the steps of:
   receiving a first layout that is not resolution enhanced;
   receiving a second layout corresponding to the first layout, the second layout being a resolution enhanced layout of the first layout; and
   generating a third layout based upon the first layout and the second layout, the third layout including a plurality of fragments and a plurality of biases associated with the fragments, the fragments corresponding to parts of the first layout and the biases indicating distances between the fragments and the second layout, wherein generating the third layout comprises applying a two-layer geometry algorithm to the first layout and the second layout to generate a fourth layout, the fourth layout including vertices located at intersections of the first layout and the second layout, the vertices determining an initial set of the fragments and an initial set of the biases associated with the initial set of the fragments; and a processor module for executing the computer instructions.

11. The layout generation system of claim 10, wherein the method further comprises the steps of:

applying shape definition rules to the initial set of the fragments to identify a plurality of shapes in the fourth layout;

applying fragmentation rules associated with the shape definition rules to identify additional vertices in the fourth layout and subdivide at least part of the initial set of the fragments; and assigning attributes to the subdivided fragments to obtain the third layout, the attributes including locations of the fragments, types of the fragments, and the biases associated with the fragments.

* * * * *